(12) United States Patent
Okamura et al.

(10) Patent No.: US 8,598,649 B2
(45) Date of Patent: Dec. 3, 2013

(54) NONVOLATILE SEMICONDUCTOR MEMORY DEVICE AND METHOD FOR MANUFACTURING SAME

(75) Inventors: Takayuki Okamura, Tokyo (JP); Noboru Ooike, Kanagawa-ken (JP); Wataru Sakamoto, Tokyo (JP); Takashi Izumida, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 283 days.

(21) Appl. No.: 12/792,378

(22) Filed: Jun. 2, 2010

(65) Prior Publication Data

US 2010/0320527 A1    Dec. 23, 2010

(30) Foreign Application Priority Data

Jun. 23, 2009  (JP) ................................. 2009-148546
Sep. 25, 2009  (JP) ................................. 2009-221337

(51) Int. Cl.
*H01L 29/792* (2006.01)
*H01L 21/3205* (2006.01)
*H01L 21/4763* (2006.01)

(52) U.S. Cl.
USPC .............. 257/324; 257/E29.309; 257/E21.21; 438/591

(58) Field of Classification Search
USPC .......................................... 257/324; 438/591
See application file for complete search history.

(56) References Cited

U.S. PATENT DOCUMENTS

| 6,995,424 B2 | 2/2006 | Lee |
| 7,518,915 B2 | 4/2009 | Noguchi |
| 2007/0171720 A1* | 7/2007 | Noguchi .................. 365/185.17 |

FOREIGN PATENT DOCUMENTS

| JP | 11-224940 | 8/1999 |
| JP | 2002-26153 A | 1/2002 |
| JP | 2004-221589 | 8/2004 |
| JP | 2008-053651 A | 3/2008 |
| JP | 2008-118100 A | 5/2008 |
| JP | 2008-258642 | 10/2008 |
| JP | 2008-277736 A | 11/2008 |

OTHER PUBLICATIONS

U.S. Appl. No. 12/562,479, filed Sep. 18, 2009, Hiroaki Hazama.
Japanese Office Action issued Jun. 24, 2013 in Japanese Patent Application No. 2009-221337 (with English translation).
Japanese Office Action issued Sep. 11, 2013 in counterpart Japanese Patent Application No. 2009-221337 (with English translation).

* cited by examiner

*Primary Examiner* — Fernando L Toledo
*Assistant Examiner* — Valerie N Newton
(74) *Attorney, Agent, or Firm* — Oblon, Spivak, McClelland, Maier & Neustadt, L.L.P.

(57) ABSTRACT

A nonvolatile semiconductor memory device according to embodiment includes: a semiconductor substrate having an upper portion being partitioned into a plurality of semiconductor portions extending in a first direction; a charge storage film provided on the semiconductor portion; a word-line electrode provided on the semiconductor substrate and extending in a second direction intersecting with the first direction; and a pair of selection gate electrodes provided on both sides of the word-line electrode in the first direction on the semiconductor substrate and extending in the second direction, a shortest distance between a corner portion of each of the semiconductor portions and each of the selection gate electrodes being longer than a shortest distance between the corner portion of the semiconductor portion and the word-line electrode in a cross section parallel to the second direction.

12 Claims, 36 Drawing Sheets

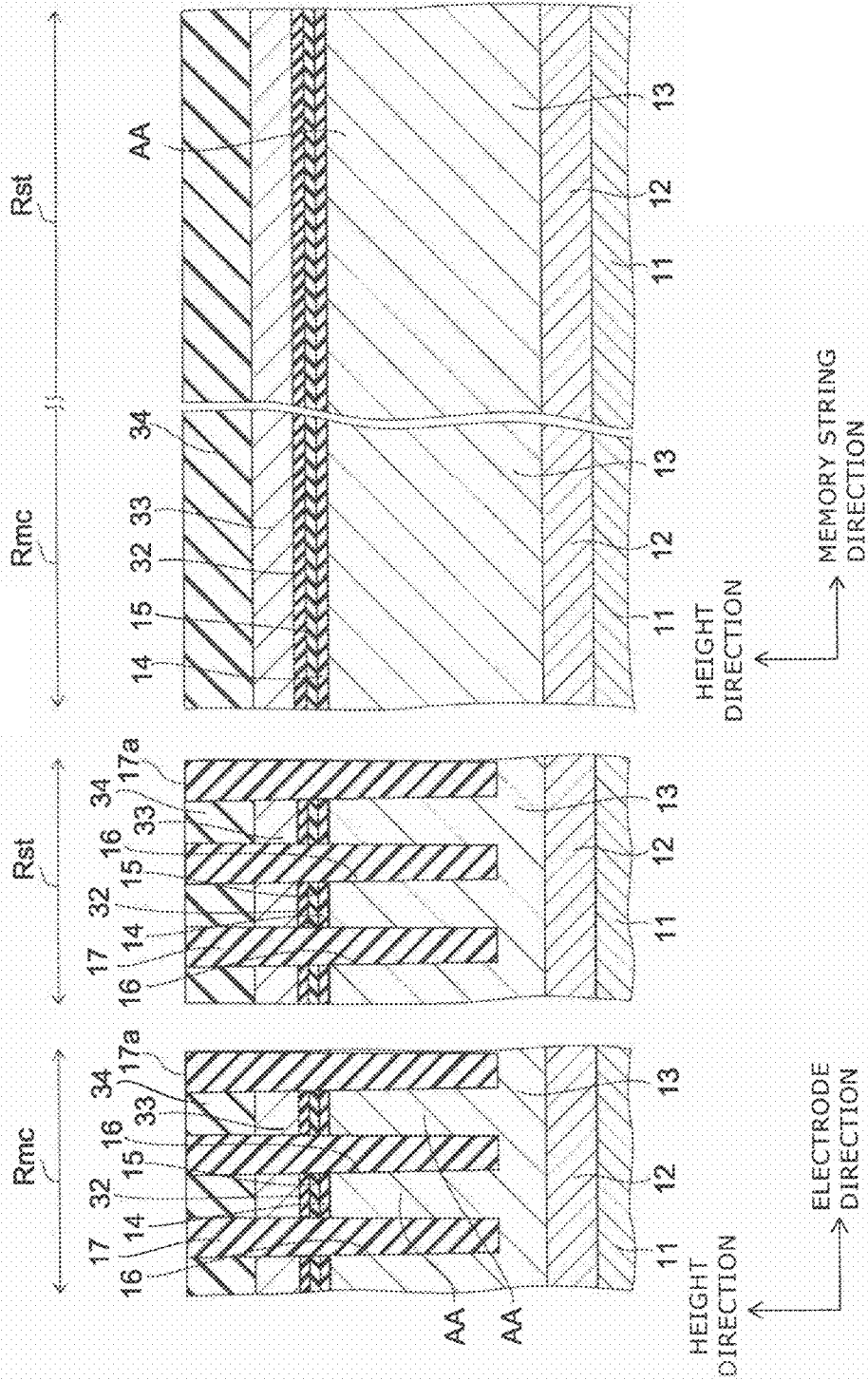

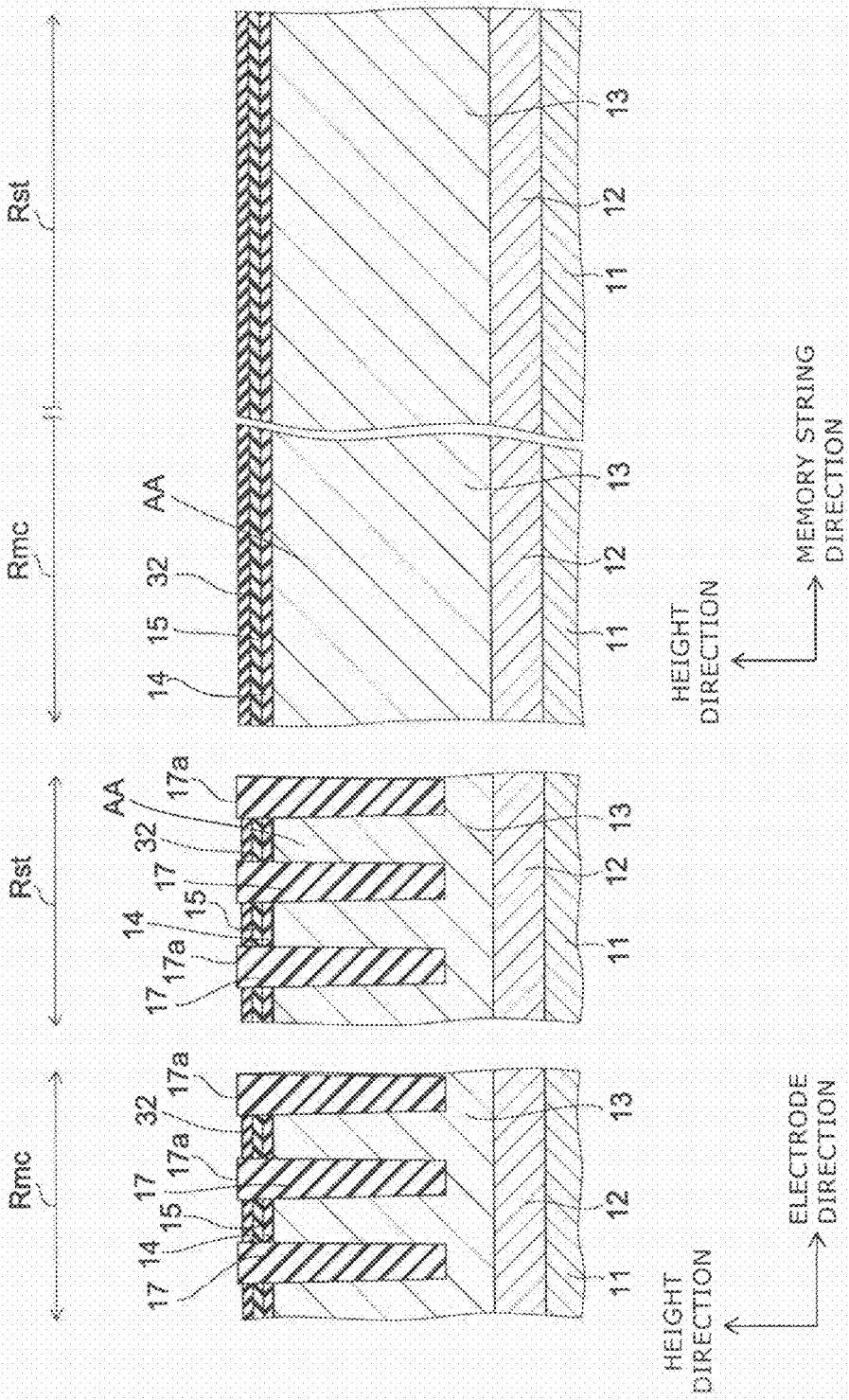

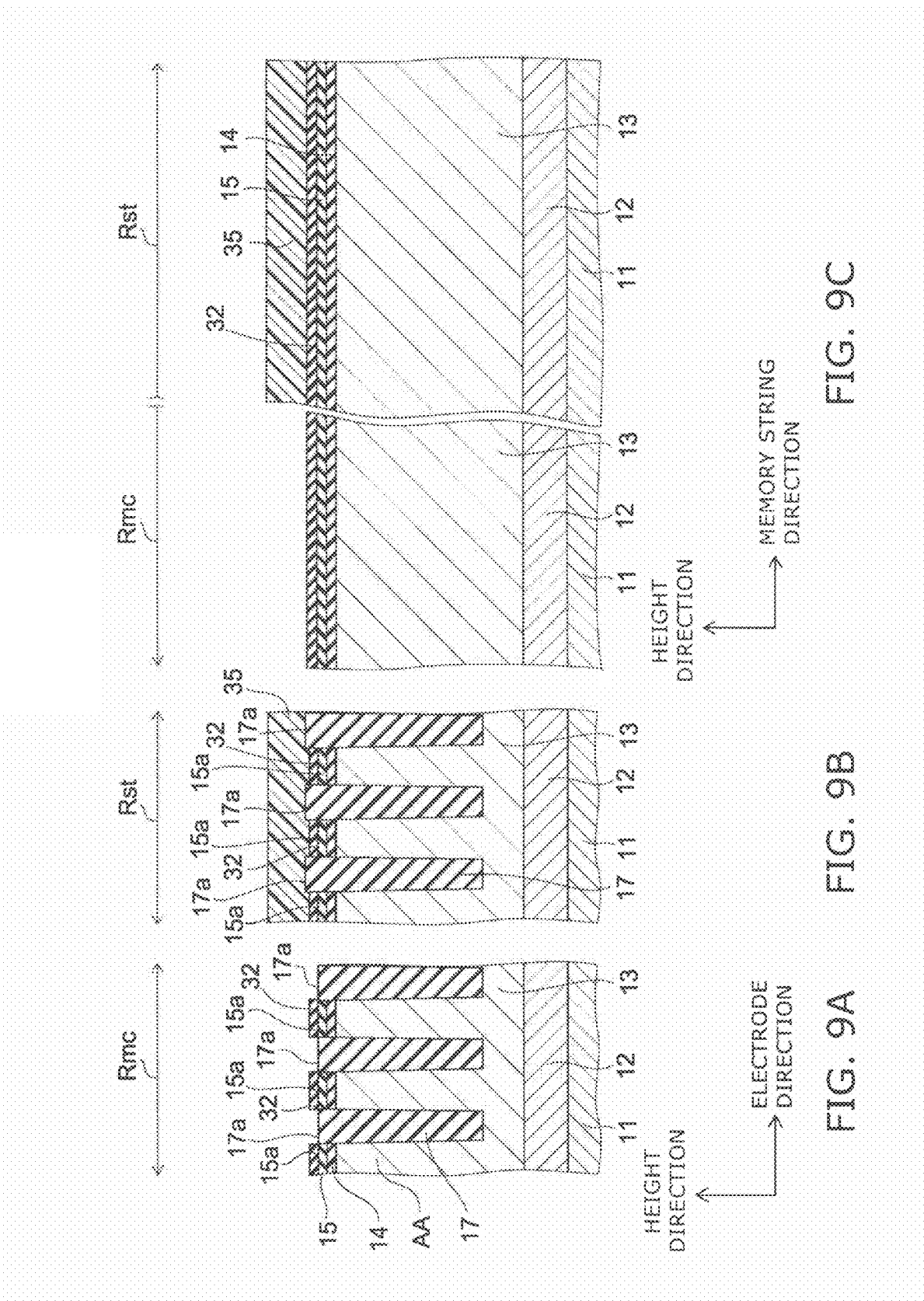

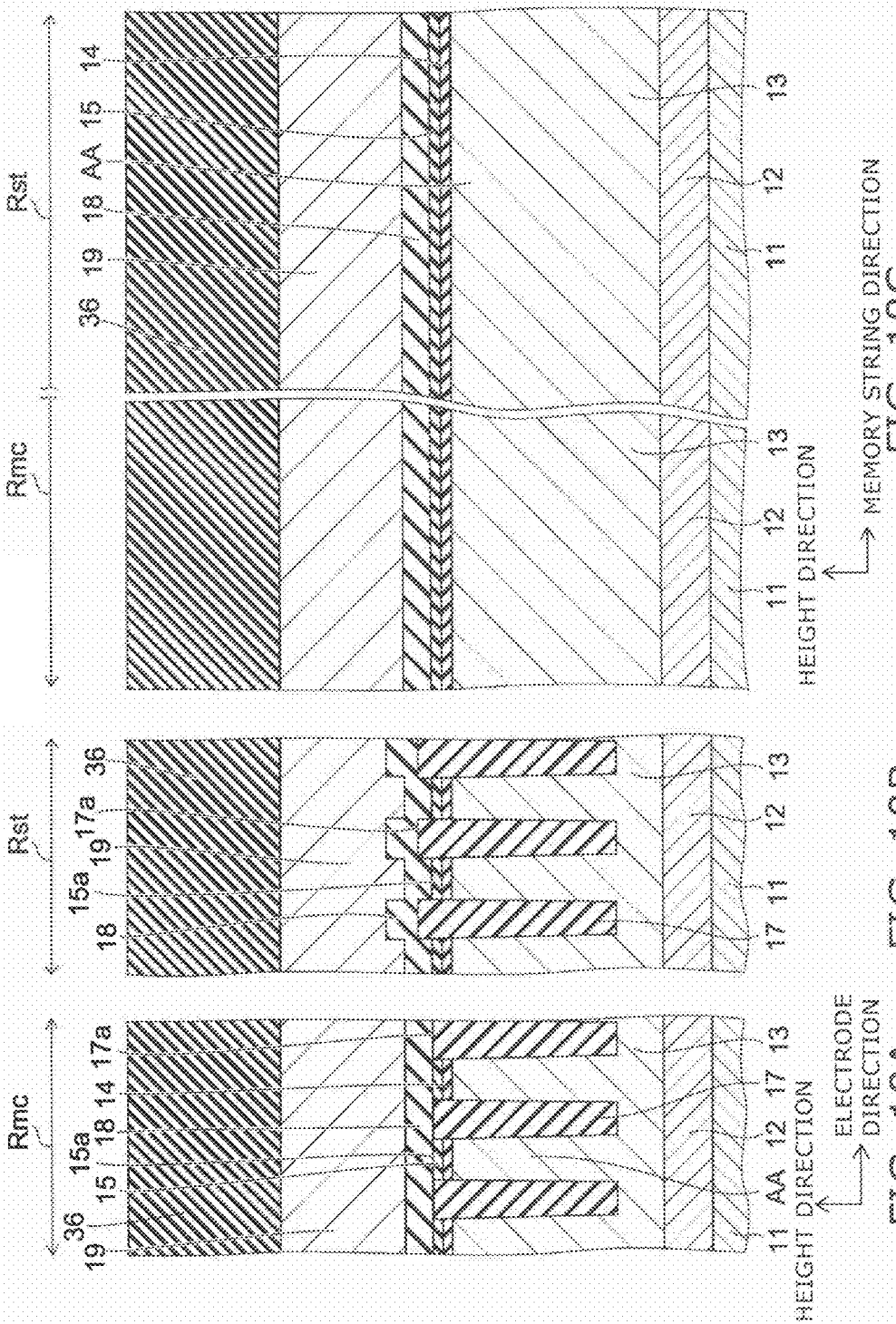

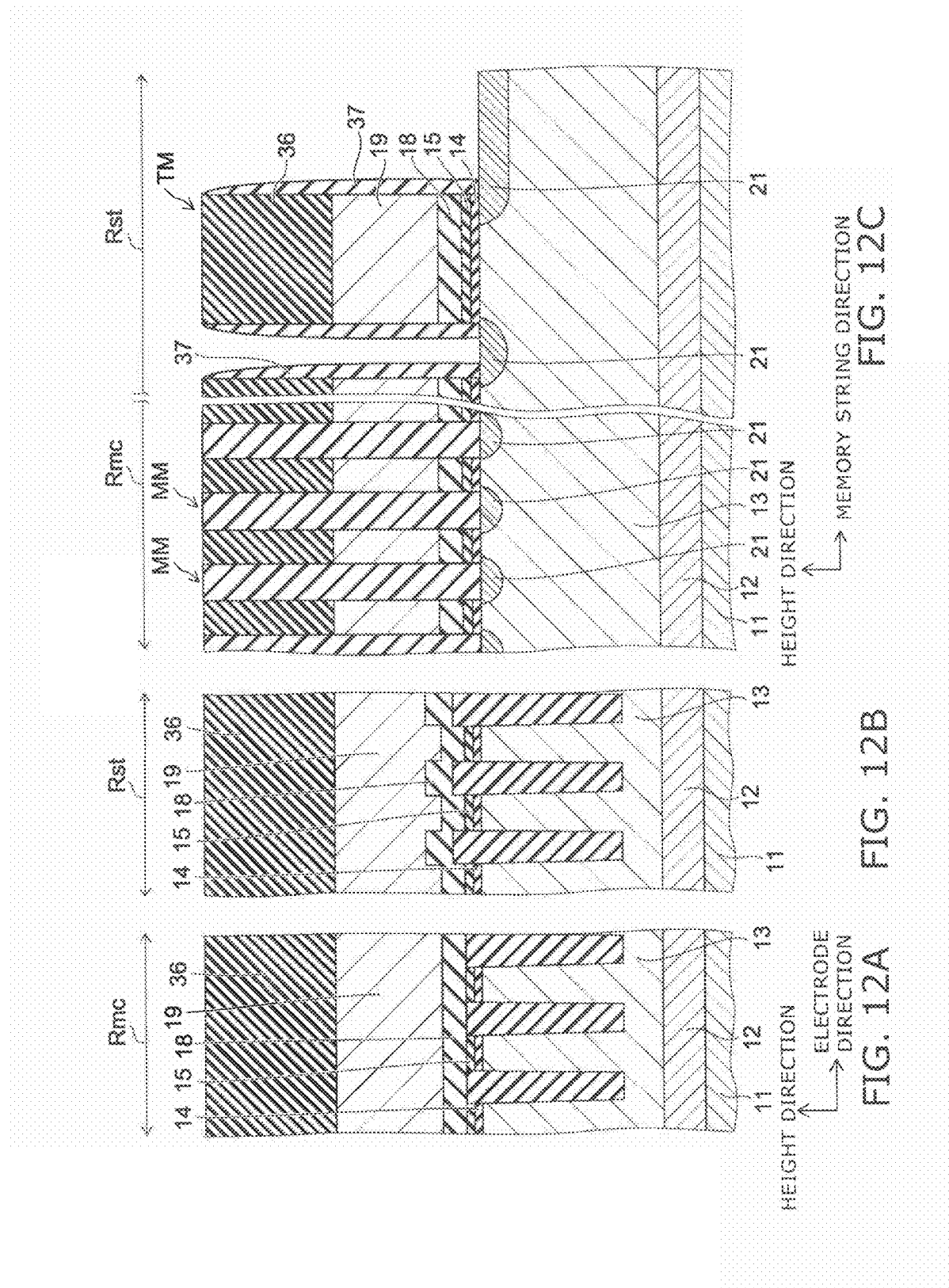

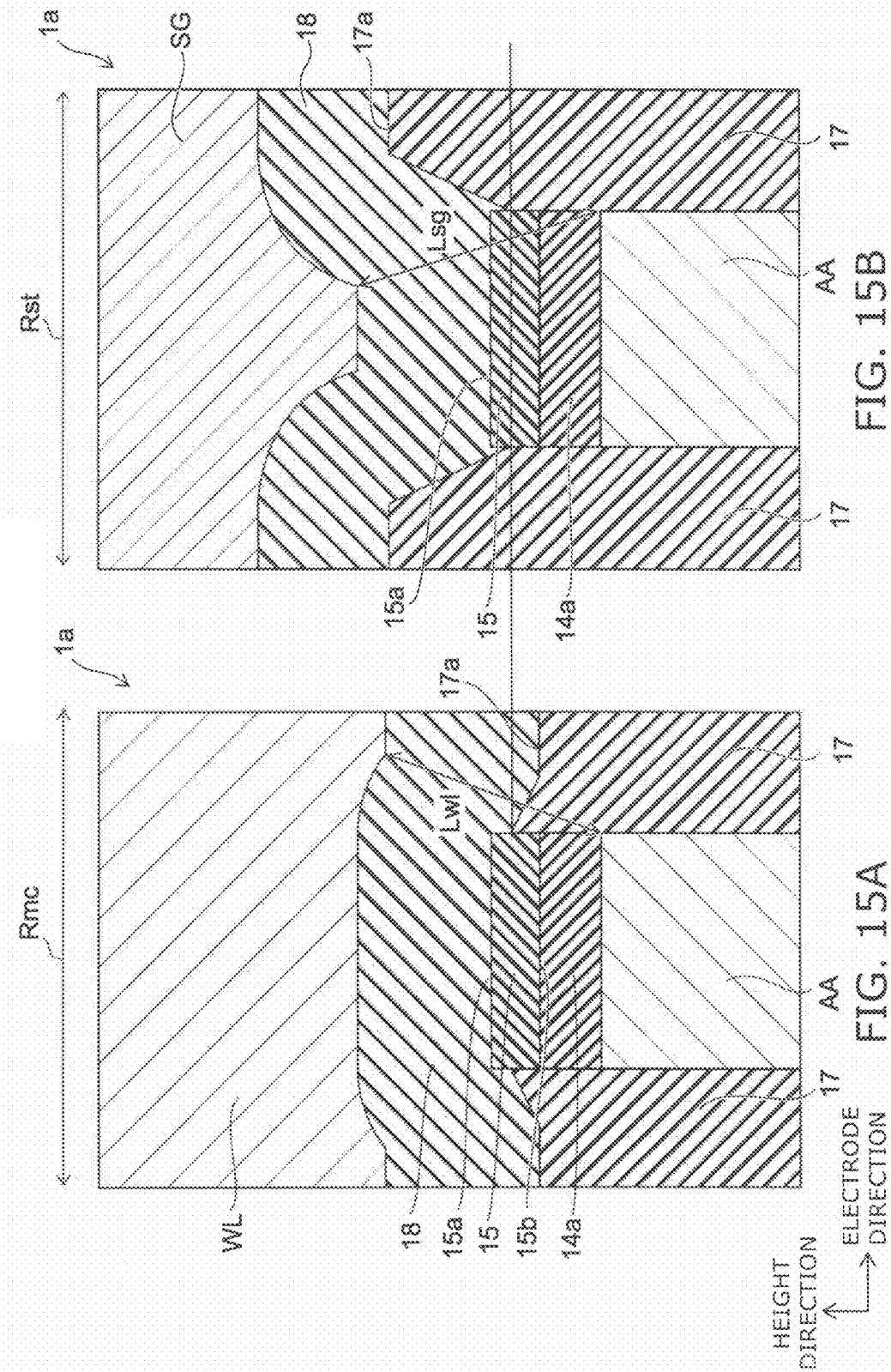

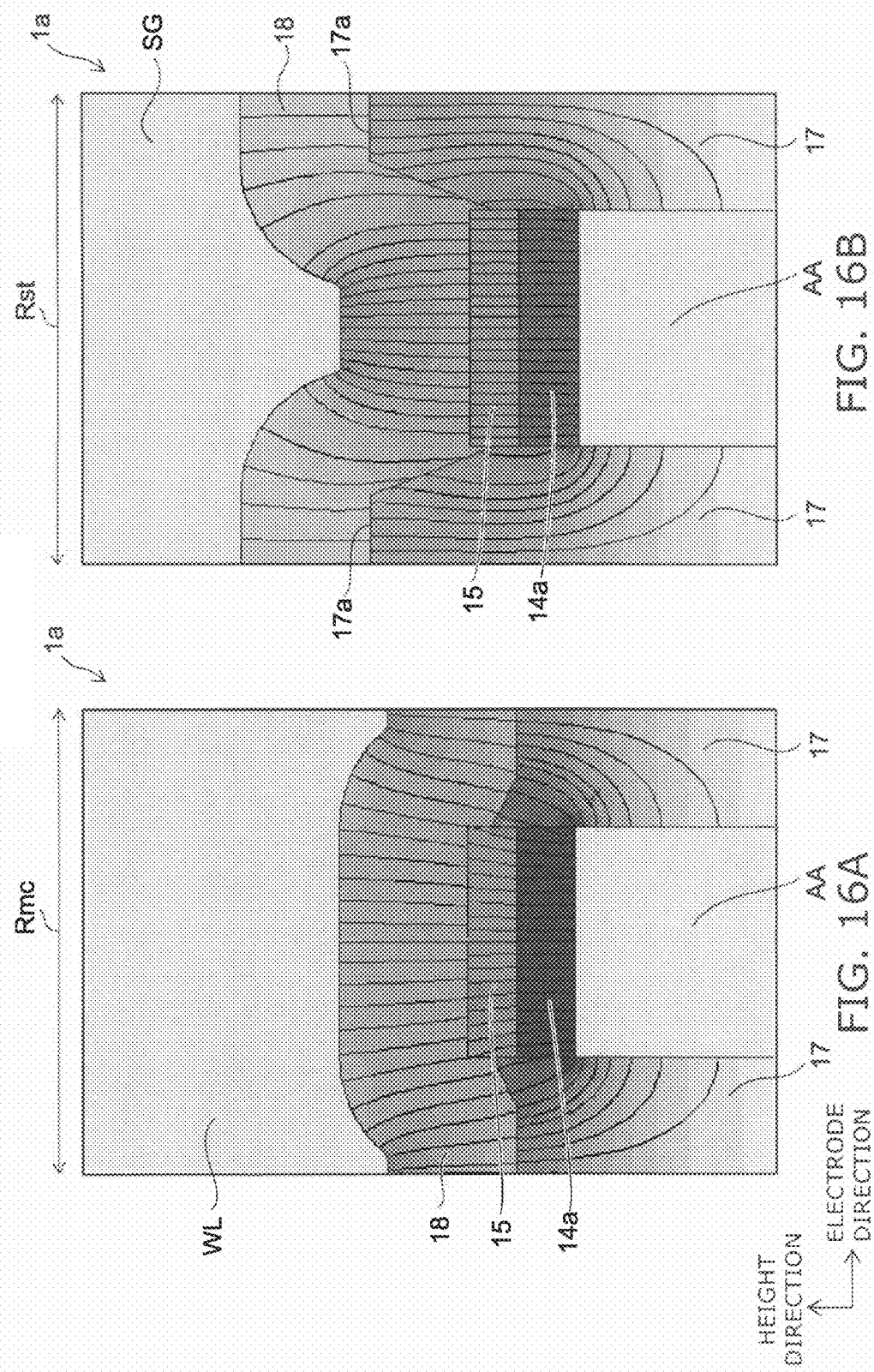

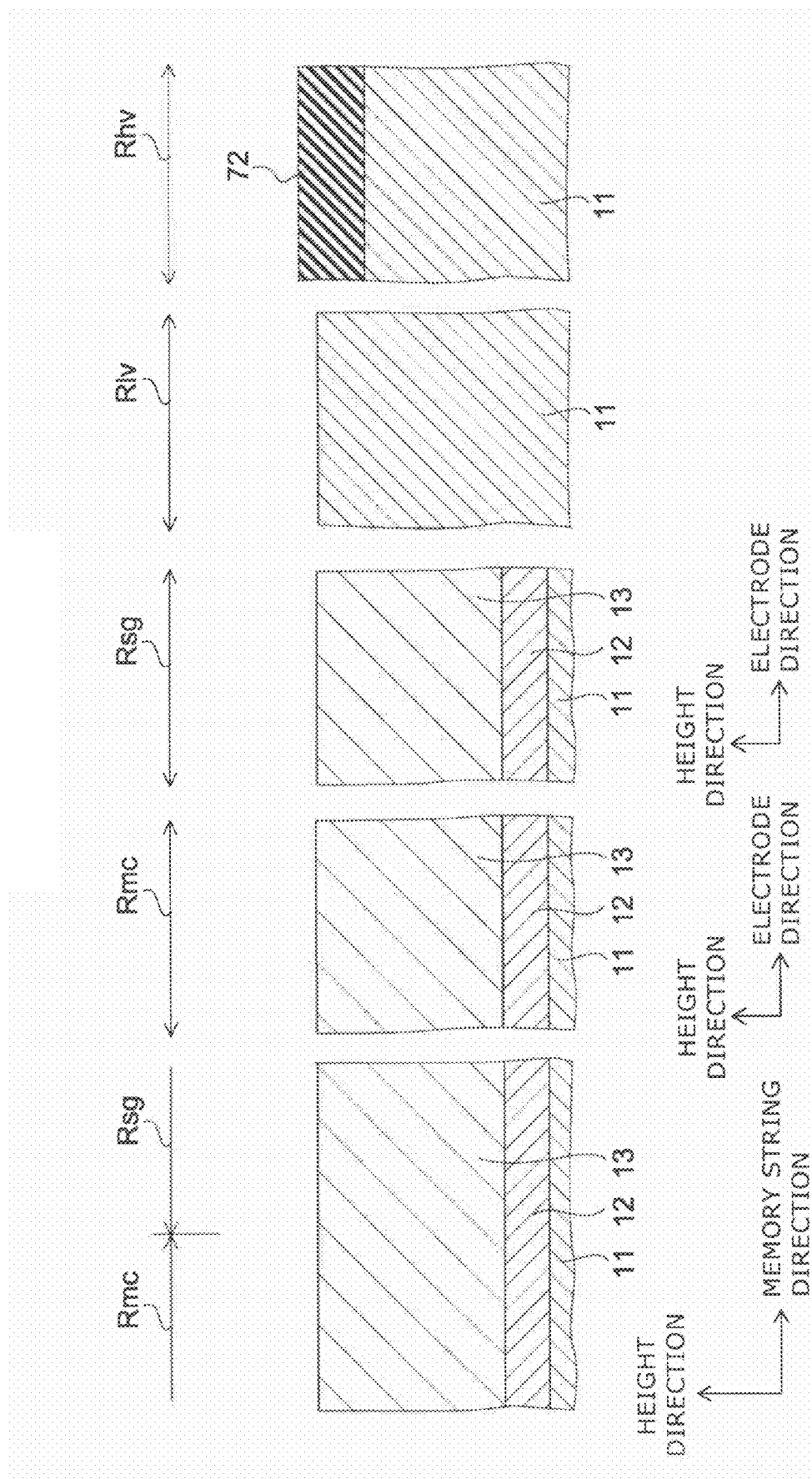

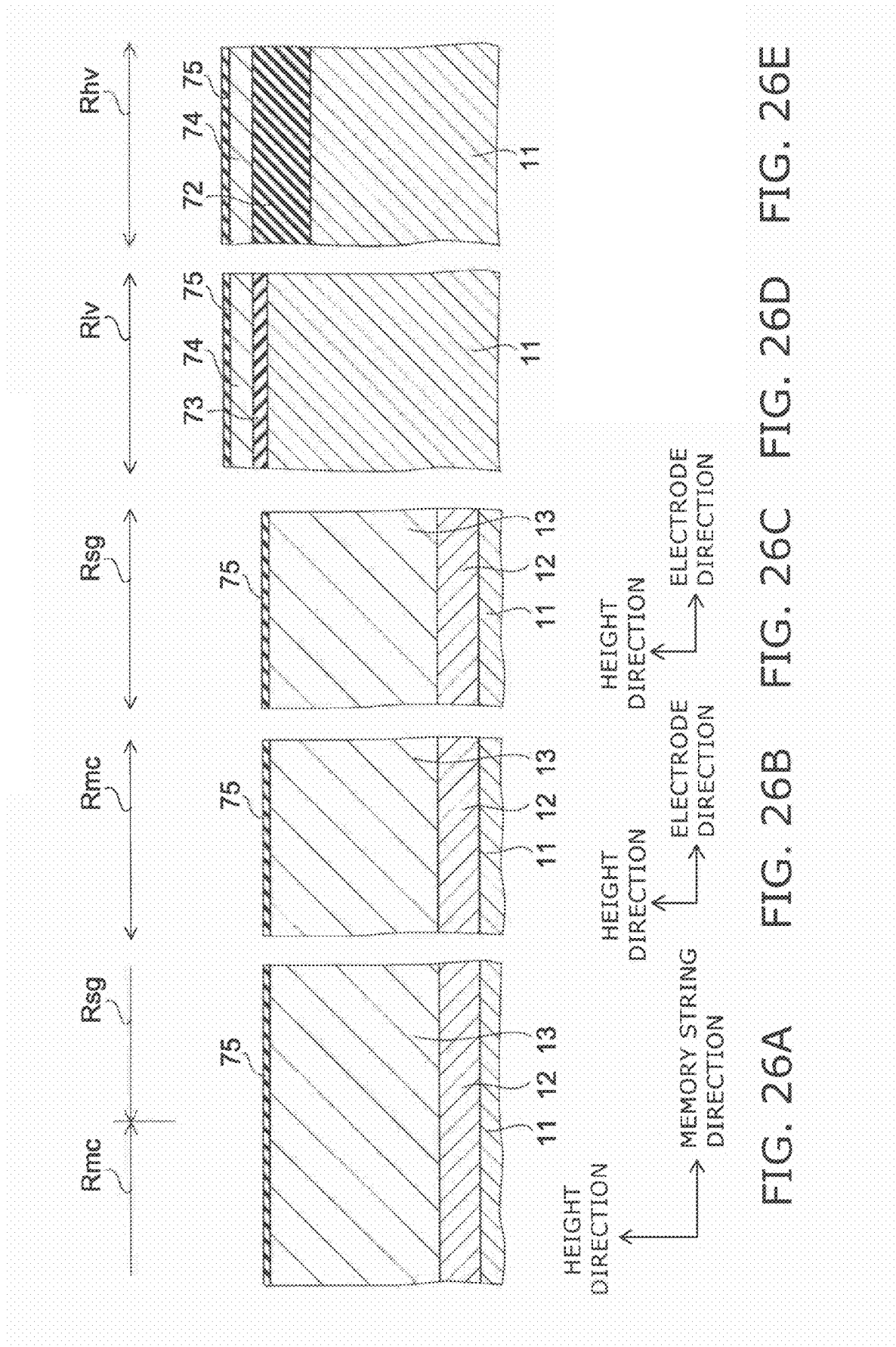

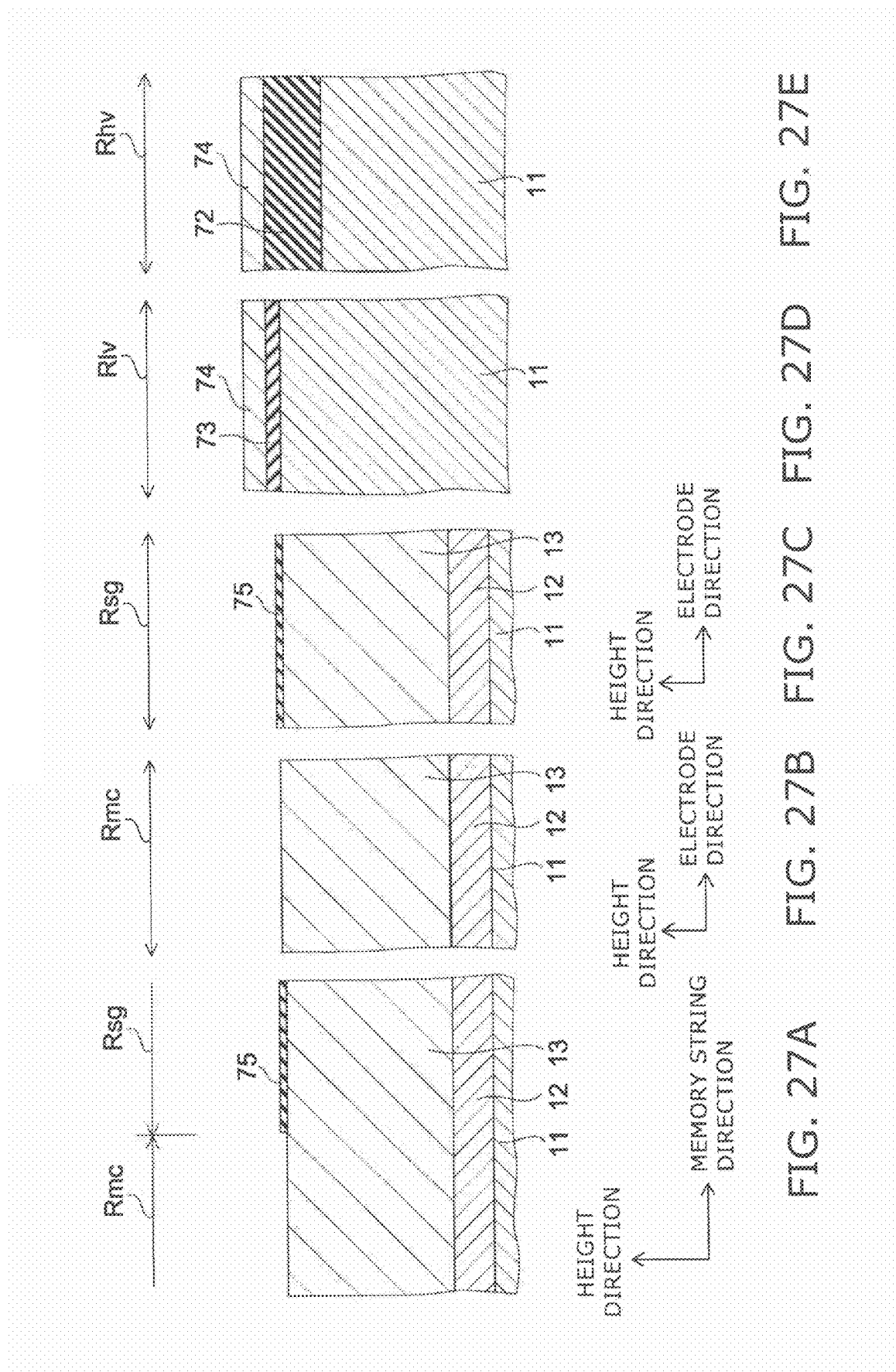

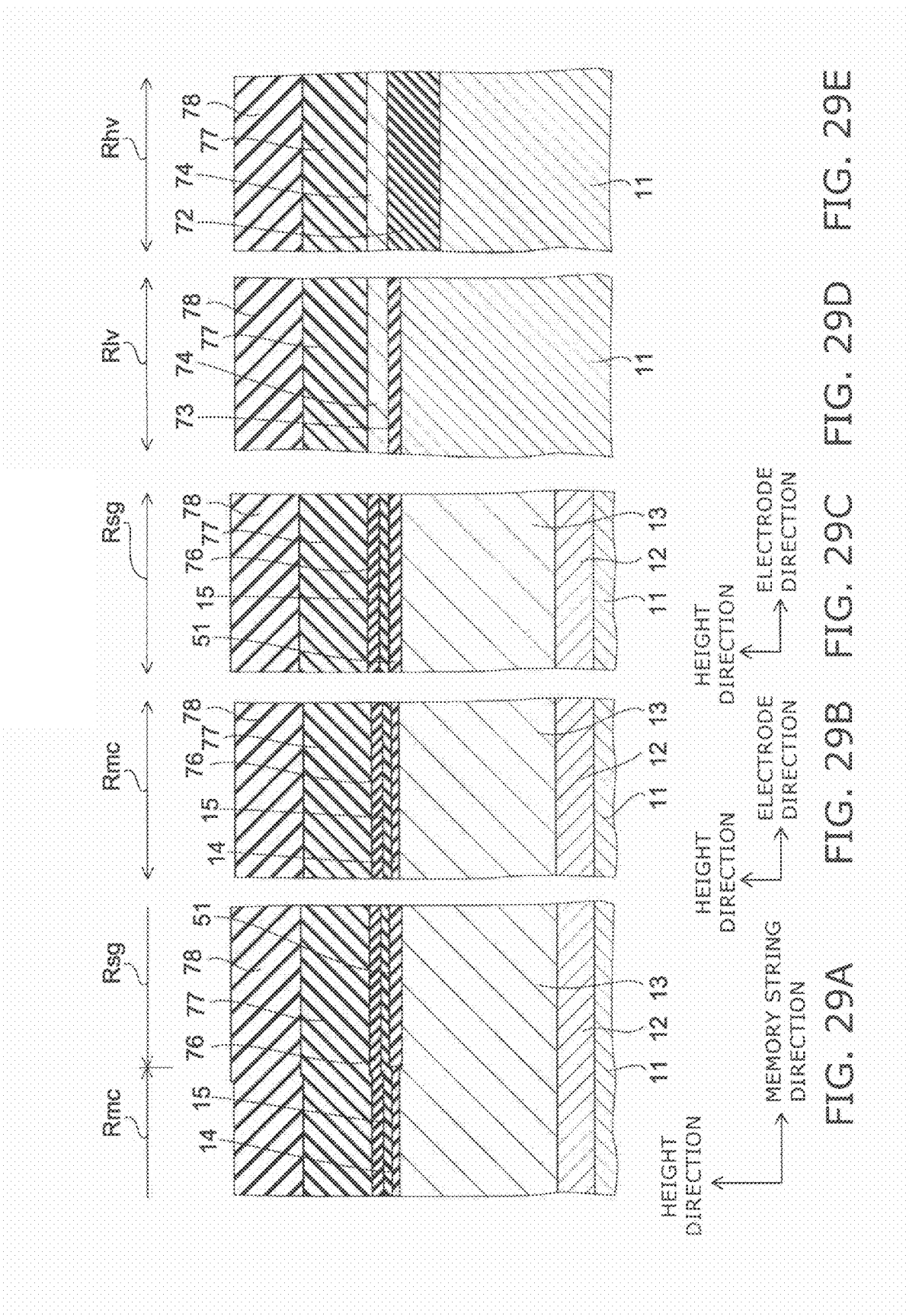

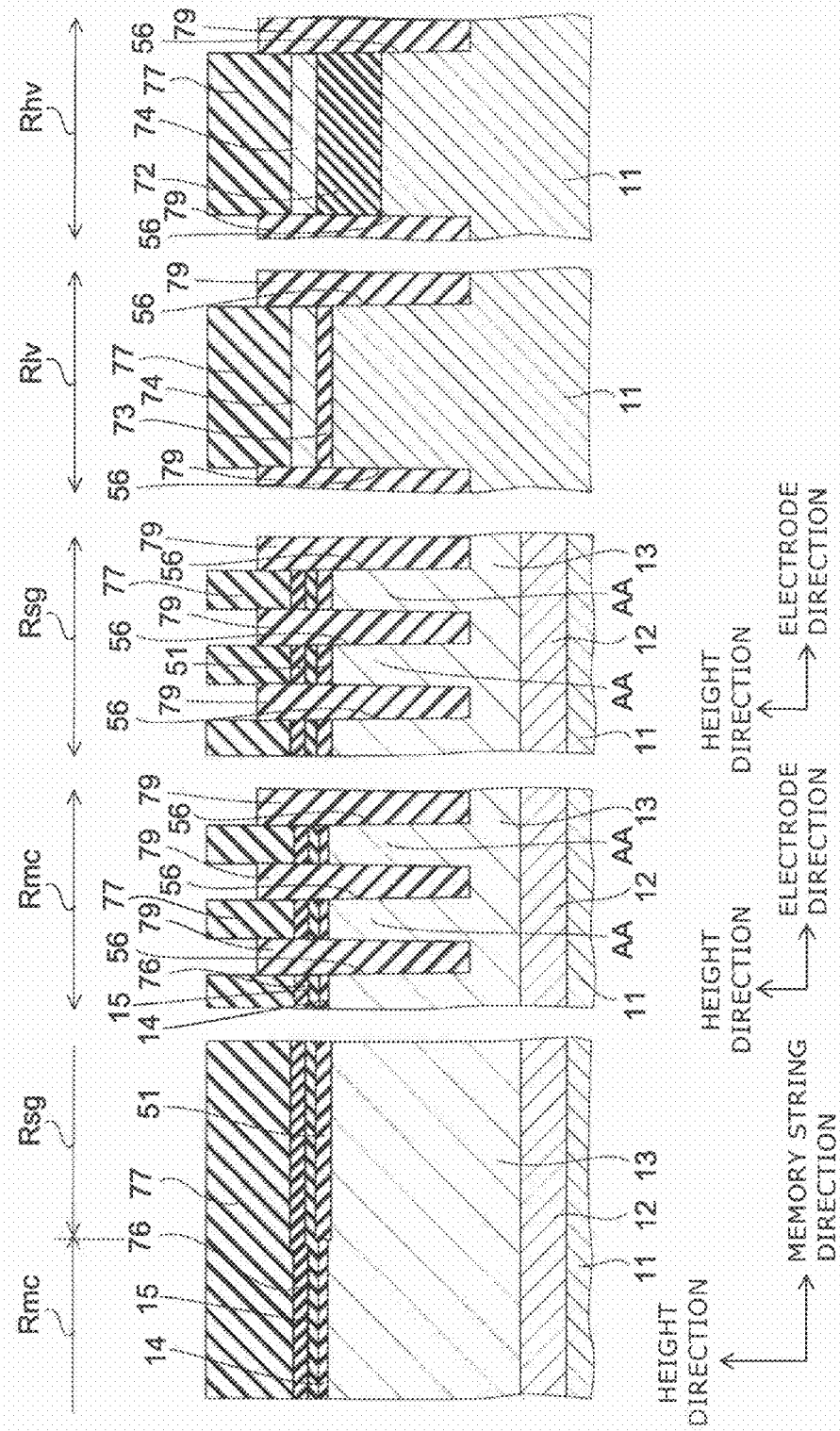

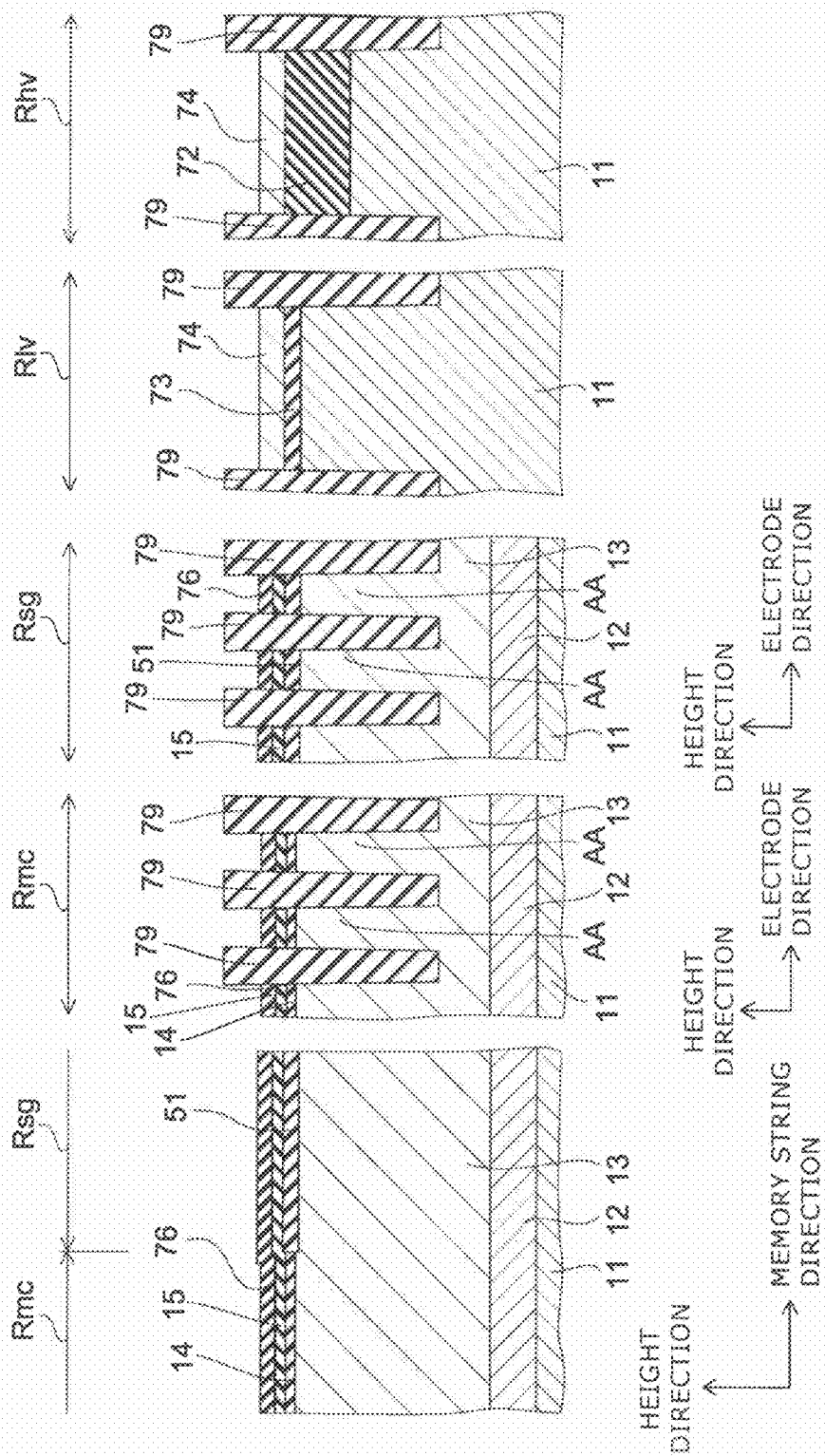

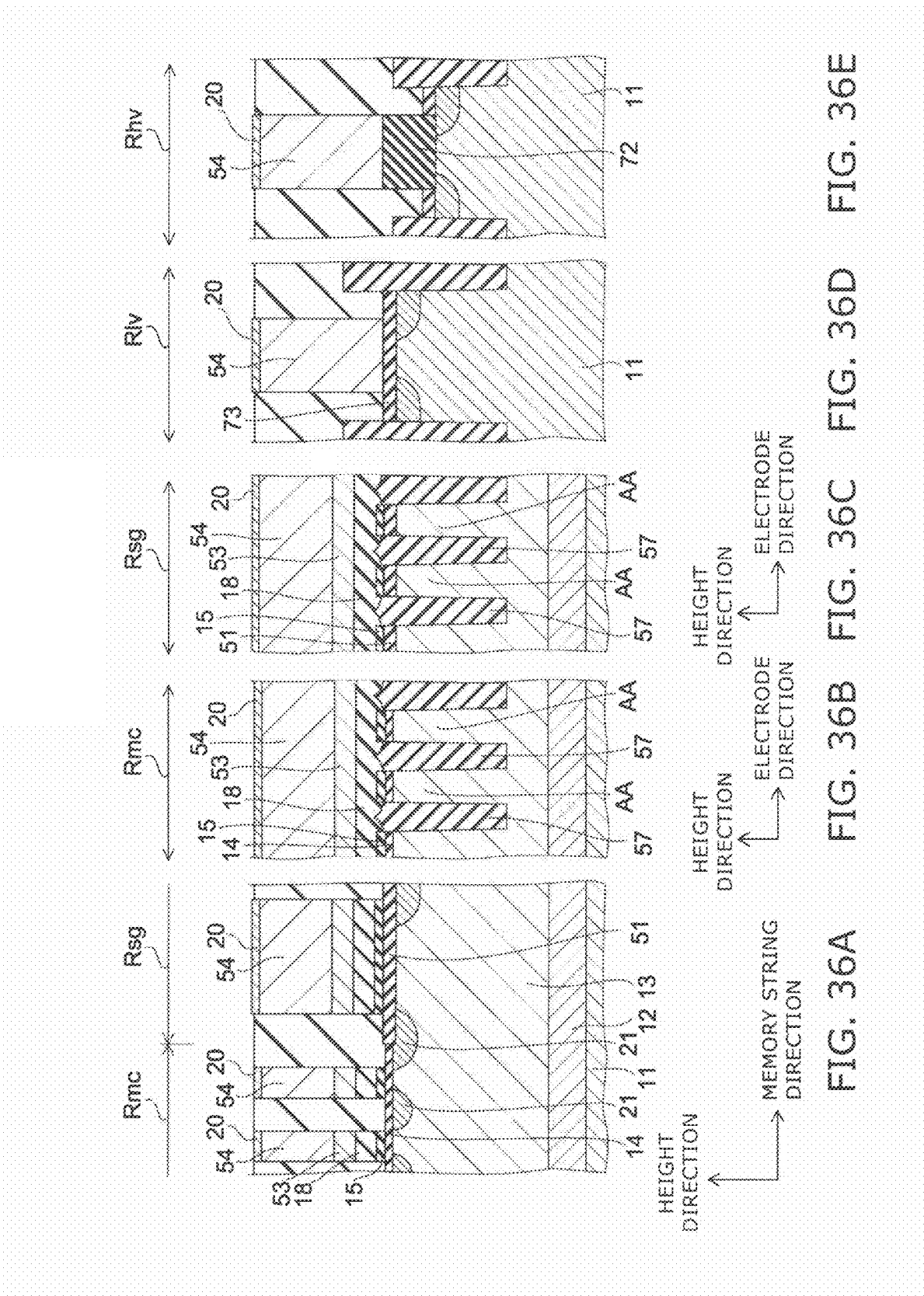

US 8,598,649 B2

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2009-148546, filed on Jun. 23, 2009 and the prior Japanese Patent Application No. 2009-221337, filed on Sep. 25, 2009; the entire contents of which are incorporated herein by reference.

FIELD

The embodiments relates to a NAND-type nonvolatile semiconductor memory device that memorizes data by storing a charge in an insulating film and a method for manufacturing the same.

BACKGROUND

A charge trapping nonvolatile memory, which memorizes data by trapping a charge in an insulating film, is known as a nonvolatile semiconductor memory device that can electrically program and erase data. For example, a MONOS-type memory is known as such a memory, in which a transistor of MONOS (metal electrode/oxide film/silicon nitride film/oxide film/semiconductor substrate) structure is used for the memory cell transistor. In this MONOS-type memory, the threshold of the cell transistor is controlled by injecting an electron into the silicon nitride film via the oxide film formed on the semiconductor substrate to trap the electron at the charge capture position, or by injecting a hole to annihilate the trapped electron, and thereby data can be stored.

In this charge trapping nonvolatile memory, since the charge storage unit is an insulating film, there is little interference with an adjacent cell due to capacity coupling between charge storage units. Therefore, the charge trapping nonvolatile memory, which uses an insulating film as the charge storage unit, is suitable for shrinking of cell area compared to a floating gate nonvolatile memory, which has a conductive floating gate as the charge storage unit.

However, in this charge trapping nonvolatile memory, a gate insulating film of the same structure as the memory cell transistor is used also for a selection transistor that selects a memory string. Therefore, a charge storage film is provided also in the gate insulating film of the selection transistor. Accordingly, if reading operation is performed a number of times, a charge is injected into the charge storage film of the selection transistor due to the voltage stress applied to the gate electrode of the selection transistor at the time of reading operation, and this results in a fluctuation in the threshold of the selection transistor over time, which may cause the charge trapping nonvolatile memory to malfunction.

BRIEF DESCRIPTION OF THE DRAWINGS

FIGS. 5A to 13C are process cross-sectional views illustrating a method for manufacturing the nonvolatile semiconductor memory device according to the first embodiment;

FIG. 14A illustrates a memory cell region Rmc, and FIG. 14B illustrates a selection transistor region Rst;

FIGS. 15A and 15B are cross-sectional views illustrating a nonvolatile semiconductor memory device according to a variation example of the first embodiment, where FIG. 15A illustrates a memory cell region Rmc, and FIG. 15B illustrates a selection transistor region Rst;

FIGS. 16A and 16B are schematic cross-sectional views illustrating simulation results of the electric field distribution in a nonvolatile semiconductor memory device according to a first variation example of the first embodiment, where FIG. 16A illustrates a memory cell region Rmc, and FIG. 16B illustrates a selection transistor region Rst;

FIG. 18A illustrates the device according to the first embodiment, and FIG. 18B illustrates the device according to the second variation example;

FIG. 19A illustrates programming characteristics, and FIG. 19B illustrates erasing characteristics;

FIG. 22A illustrates a memory cell region Rmc, and FIG. 22B illustrates a selection transistor region Rsg; and FIGS. 23A to 36E are process cross-sectional views illustrating a method for manufacturing the nonvolatile semiconductor memory device according to the second embodiment.

DETAILED DESCRIPTION OF THE INVENTION

Figure 1:
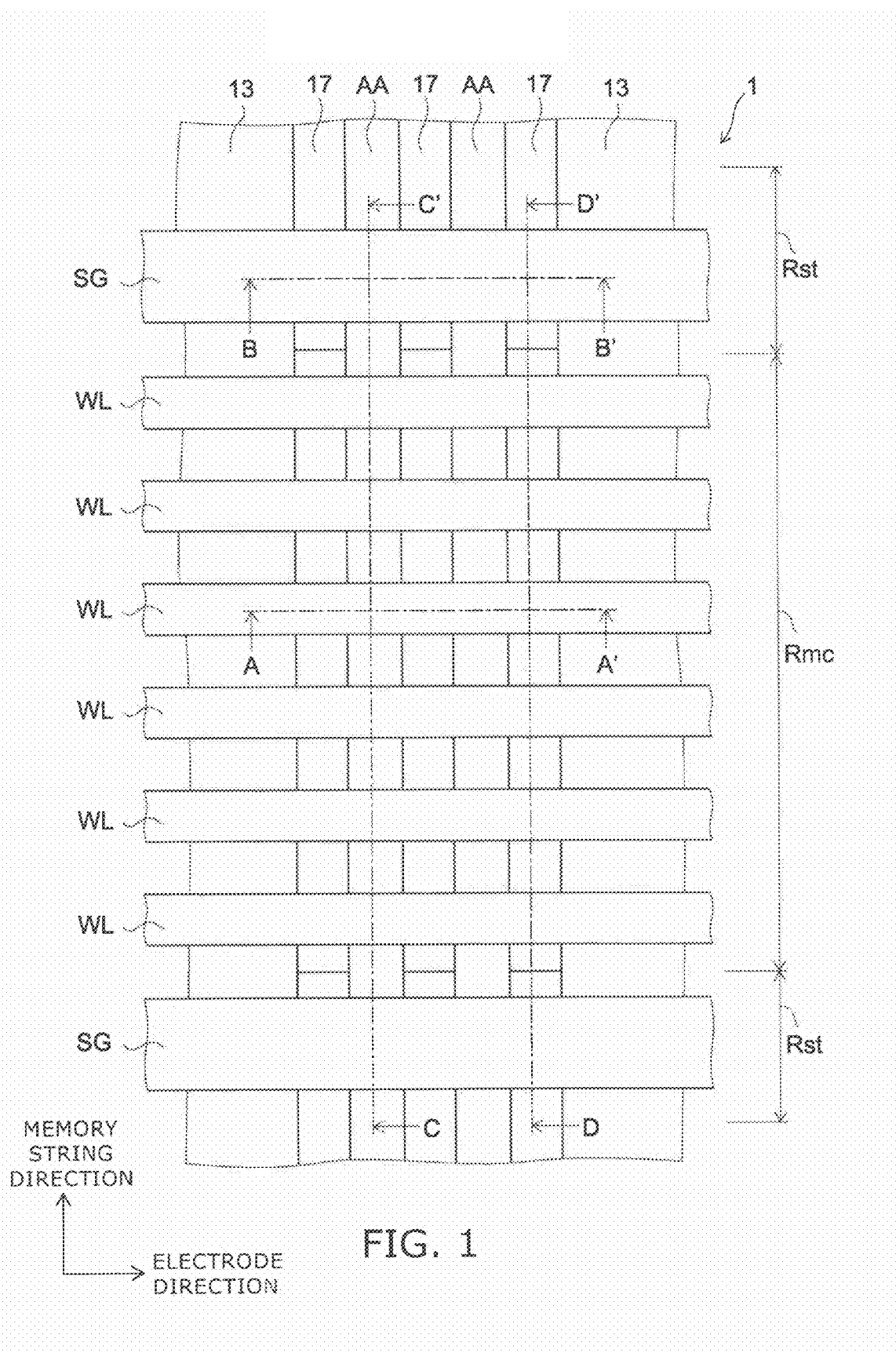
FIG. 1 is a plan view illustrating a nonvolatile semiconductor memory device according to a first embodiment.

According to an aspect, there is provided a nonvolatile semiconductor memory device including: a semiconductor substrate having an upper portion being partitioned into a plurality of semiconductor portions extending in a first direction; charge storage films provided on the semiconductor portions; a word-line electrode provided on the semiconductor substrate and extending in a second direction intersecting with the first direction; and a pair of selection gate electrodes provided on both sides of the word-line electrode in the first direction on the semiconductor substrate and extending in the second direction, a shortest distance between a corner portion of each of the semiconductor portions and each of the selection gate electrodes being longer than a shortest distance between the corner portion of the semiconductor portion and the word-line electrode in a cross section parallel to the second direction.

According to another aspect, there is provided a method for manufacturing a nonvolatile semiconductor memory device including: forming a charge storage film on a semiconductor substrate; forming a pad insulating film on the charge storage film; forming a plurality of element isolation insulating films extending in a first direction in the pad insulating film, the charge storage film, and an upper portion of the semiconductor substrate to divide the pad insulating film and the charge storage film in a second direction intersecting with the first direction and to partition the upper portion into a plurality of semiconductor portions extending in the first direction; removing an upper portion of each of the element isolation insulating films; removing the pad insulating film and further removing an upper portion of a first portion of each of the element isolation insulating films in the first direction; depositing an insulating material to form a block insulating film covering the charge storage film and the element isolation insulating films; and forming a word-line electrode extending in the second direction on the first portion and forming a selection gate electrode extending in the second direction on a second portion of each of the element isolation insulating films located on both sides of the first portion in the first direction.

According to another aspect, there is provided a method for manufacturing a nonvolatile semiconductor memory device including: forming oxide films in a pair of regions away from each other on an upper surface of a semiconductor substrate; performing an oxidation treatment to form a tunnel insulating film in a region between the pair of regions on the upper surface of the semiconductor substrate and to grow the oxide films in the pair of regions to form bottom insulating films thicker than the tunnel insulating film; forming a charge storage film on the tunnel insulating film and the bottom insulating films; forming a plurality of trenches connecting the pair of regions to each other in the charge storage film, the tunnel insulating film, each of the bottom insulating films, and an upper portion of the semiconductor substrate to partition the upper portion into a plurality of semiconductor portions extending in a first direction; burying an insulator in the trench; removing an upper portion of the insulator by performing etching using the charge storage film as a film for etching adjustment to cause a remaining portion of the insulator to form an element isolation insulating film; depositing an insulating material to form a block insulating film covering the charge storage film and the element isolation insulating film; forming a conductive film on the block insulating film; and dividing the conductive film, the block insulating film, and the charge storage film in the first direction to form a word-line electrode extending in a second direction intersecting with the first direction in a region immediately above the tunnel insulating film and to form a selection gate electrode extending in the second direction in a region immediately above each of the bottom insulating films.

Embodiments of the invention will now be described with reference to the drawings.

First, a first embodiment will now be described.

FIG. 1 is a plan view illustrating a nonvolatile semiconductor memory device according to this embodiment.

Figure 2:
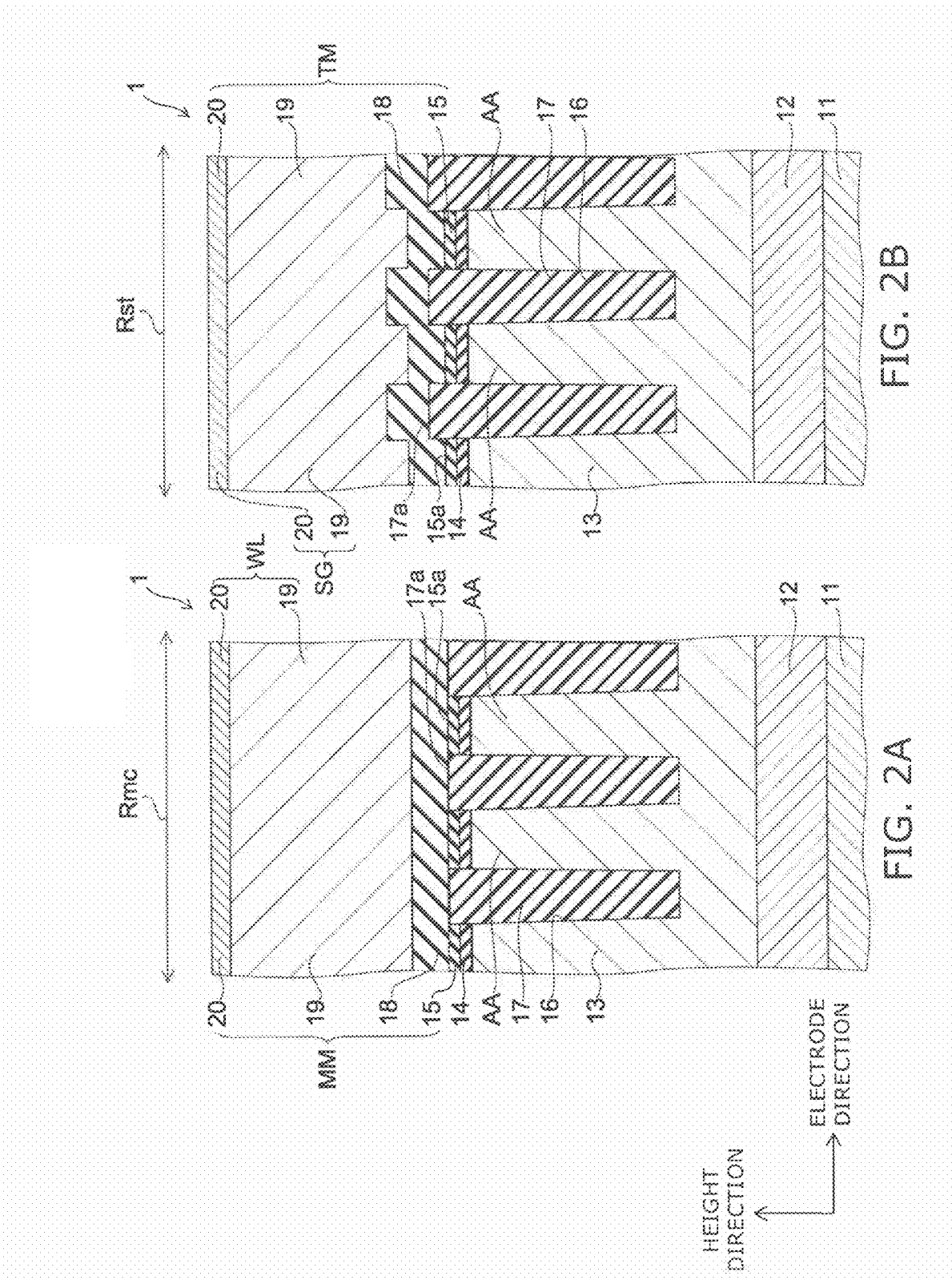
FIG. 2A is a cross-sectional view taken along line A-A' illustrated in FIG. 1.
FIG. 2B is a cross-sectional view taken along line B-B' illustrated in FIG. 1.

FIG. 2A is a cross-sectional view taken along line A-A' illustrated in FIG. 1, and FIG. 2B is a cross-sectional view taken along line B-B' illustrated in FIG. 1.

Figure 3:
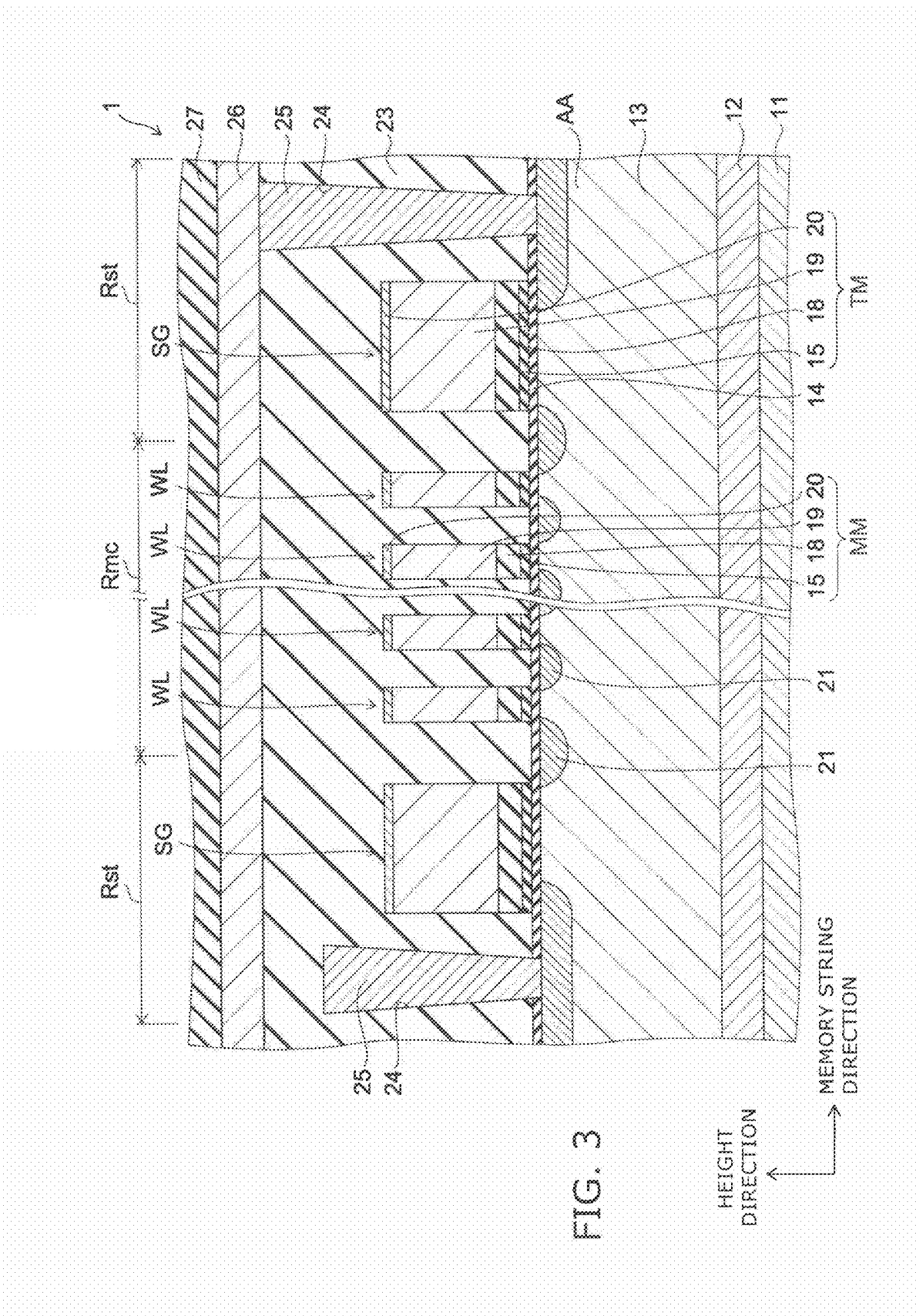
FIG. 3 is a cross-sectional view taken along line C-C' illustrated in FIG. 1.

FIG. 3 is a cross-sectional view taken along line C-C' illustrated in FIG. 1.

Figure 4:
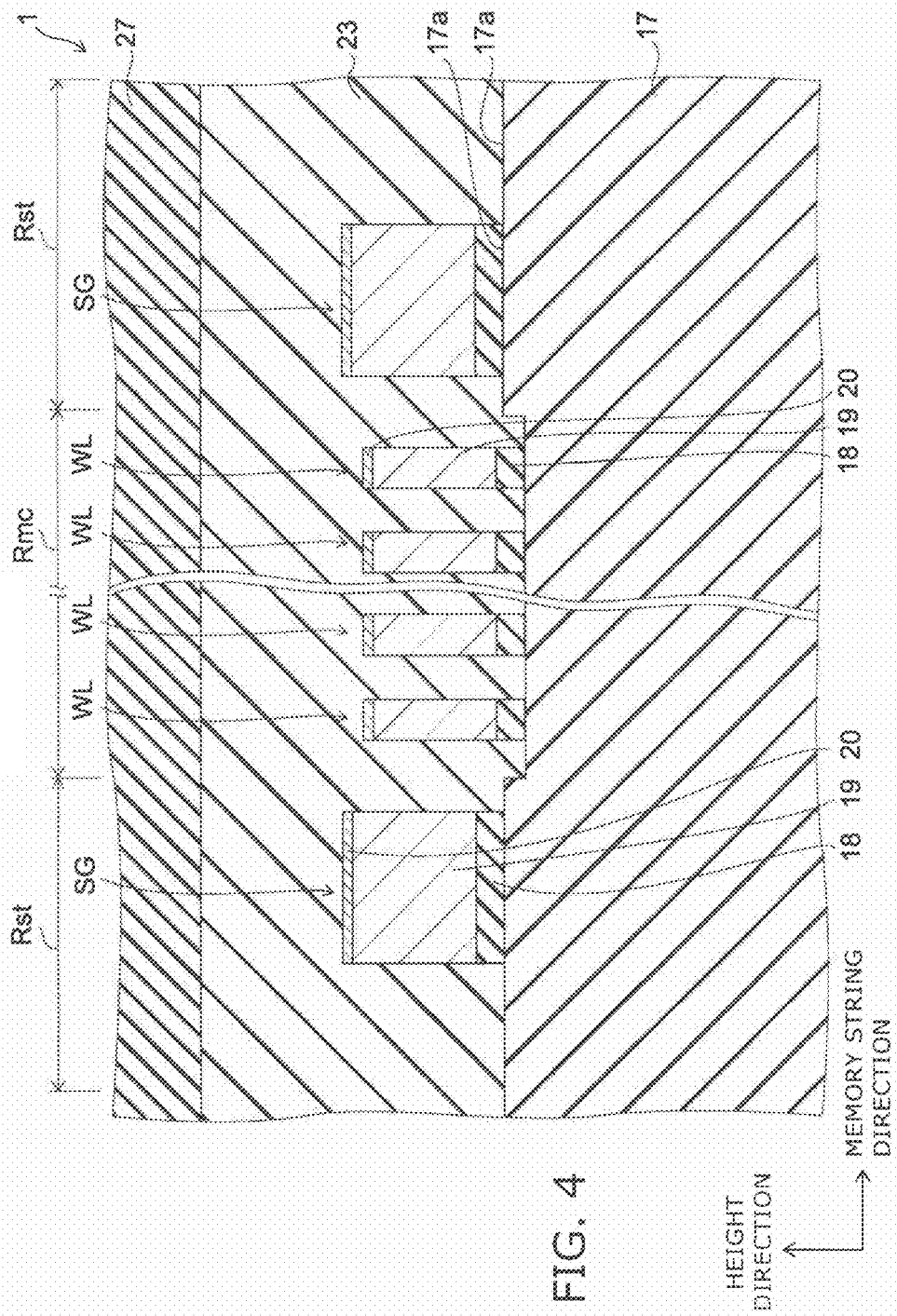
FIG. 4 is a cross-sectional view taken along line D-D' illustrated in FIG. 1.

FIG. 4 is a cross-sectional view taken along line D-D' illustrated in FIG. 1.

In FIG. 1, for convenience of illustration, the interlayer insulating film, a contact, and a bit line described later are omitted.

As illustrated in FIGS. 1 to 4, a nonvolatile semiconductor memory device 1 (hereinafter may be simply referred to as a "device 1") according to this embodiment is a MONOS-type NAND flash memory. A silicon substrate 11 is provided in the device 1. A memory array unit that stores data and a periphery circuit unit that drives the memory array unit are provided in the device 1. A plurality of memory cells are provided in the memory array unit. The device 1 according to this embodiment has a feature in the configuration of the memory array unit. Therefore, a description of the configuration of the periphery circuit unit is omitted.

The configuration of the memory array unit will now be described.

A memory cell region Rmc is set in the memory array unit, and a pair of selection transistor regions Rst are formed in the regions on both sides of the memory cell region Rmc. Hereinafter, a direction that is parallel to the upper surface of the silicon substrate 11 and is the arrangement direction of the selection transistor region Rst, the memory cell region Rmc, and the selection transistor region Rst is referred to as a "memory string direction," and a direction orthogonal to the memory string direction is referred to as an "electrode direction." The direction perpendicular to the upper surface of the silicon substrate 11 is referred to as a "height direction."

An N well 12 is formed in the upper region of the silicon substrate 11, and a P well 13 is formed in part of the upper region of the N well 12. A tunnel insulating film 14 made of silicon oxide ($SiO_2$) is formed on the upper surface of the silicon substrate 11. The tunnel insulating film 14 is normally insulative but passes a tunnel current when a prescribed voltage in the range of the driving voltage of the device 1 is applied. The tunnel insulating film 14 is formed by, for example, thermal oxidation treatment, and has a film thickness of, for example, 0.5 to 10 nm (nanometers), for example, 4 nm.

In the memory cell region Rmc, a plurality of memory cell stacked bodies MM extending in the electrode direction are provided on the tunnel insulating film 14. In each of the selection transistor regions Rst, one selection transistor stacked body TM extending in the electrode direction is provided on the tunnel insulating film 14. That is, in the memory string direction, the plurality of memory cell stacked bodies MM are arranged between a pair of selection transistor stacked bodies TM.

In each of the memory cell stacked bodies MM and selection transistor stacked body TM (hereinafter may be collectively referred to as a "strip-shaped stacked body"), a charge storage film 15 made of silicon nitride (SiN) and having a film thickness of, for example, 3 to 50 nm, for example, 5 nm, a block insulating film 18 made of alumina ($Al_2O_3$) and having a film thickness of, for example, 3 to 50 nm, for example, 10 nm, a polysilicon film 19 made of conductive polysilicon containing impurities and having a film thickness of, for example, 50 nm, and an alloy layer 20 made of cobalt silicide are stacked in the order from the lower layer side.

The charge storage film 15 is a film having charge storing capability such as a film including a trap site for electron. The block insulating film 18 is a film that substantially passes no current even if a voltage in the range of the driving voltage of the device 1 is applied, and is formed of, for example, a material having a higher dielectric constant than the tunnel insulating film 14, the charge storage film 15, and the STI 17 described later. A word-line electrode WL is disposed in the memory cell stacked body MM, and a selection gate electrode SG is disposed in the transistor stacked body TM, by using the polysilicon film 19 and the alloy layer 20. That is, the word-line electrode WL and the selection gate electrode SG (hereinafter may be collectively referred to as an "electrode") both extend in the electrode direction, and a pair of selection gate electrodes SG are provided on both sides of a group consisting of a plurality of word-line electrodes WL arranged along the memory string direction. The polysilicon film 19 is doped with high-concentration impurities (n-type impurities) serving as a donor, and has a conductivity type of $n^+$ and a film thickness of, for example, 10 to 500 nm. The alloy layer 20 is formed of, for example, metal silicide such as cobalt silicide (CoSi).

On the other hand, a plurality of trenches 16 extending in the memory string direction are formed in the upper portion of the silicon substrate 11. STIs (shallow trench isolations) 17 are formed by burying silicon oxide in the trenches 16. Thereby, the upper portion of the P well 13 is divided in the electrode direction by the STIs 17 into a plurality of active areas AA (semiconductor portions) extending in the memory string direction. A source/drain region 21 in which impurities are diffused is formed in the region in each of the active areas AA immediately below the region between strip-shaped stacked bodies. That is, a plurality of source/drain regions 21 are intermittently formed along the memory string direction in each of the active areas AA. The source/drain region 21 has a conductivity type of $N^-$, for example.

The upper portion of the STI 17 protrudes from the upper surface of the silicon substrate 11 and cuts into the lower portion of the strip-shaped stacked body. In this embodiment, the level of protrusion of the STI 17 from the silicon substrate 11 differs between the memory cell region Rmc and the selection transistor region Rst. That is, the upper surface 17a of the STI 17 in the selection transistor region Rst is located higher than the upper surface 17a of the STI 17 in the memory cell region Rmc. For example, in the memory cell region Rmc, the upper surface 17a of the STI 17 is located at nearly the same height as the upper surface 15a of the charge storage film 15, but in the selection transistor region Rst, the upper surface 17a of the STI 17 is located higher than the upper surface 15a of the charge storage film 15. Accordingly, as illustrated in FIG. 2B, in the selection transistor region Rst, the STI 17 protrudes upward from the upper surface 15a of the charge storage film 15, and the block insulating film 18 is curved to reflect the shape of this protruding portion. In other words, the region in the upper surface 17a of the STI 17 (element isolation insulating film) immediately below the selection gate electrode SG is located higher than the region immediately below the word-line electrode WL. Although the configuration of the upper surface of the block insulating film 18 is illustrated in FIG. 2B to have corner portions, the upper surface of the block insulating film 18 may have roundness. Although the configuration of the upper surface of the STI 17 have corner portion which illustrated similarly to the block insulating film 18, the upper surface of the STI 17 may have roundness.

An interlayer insulating film 23 is provided on the tunnel insulating film 14 so that the strip-shaped stacked bodies may be embedded in the interlayer insulating film 23. For example, the interlayer insulating film 23 is formed by stacking a silicon oxide film with a film thickness of 50 nm, a silicon nitride film with a film thickness of 30 nm, and a silicon oxide film with a film thickness of 350 nm in the order from the lower layer side. On the outside of a set of strip-shaped stacked bodies arranged in the memory string direction, contact holes 24 reaching the silicon substrate 11 are formed in the interlayer insulating film 23. A contact 25 in which the periphery of a core material made of a metal such as tungsten (W) is covered with a titanium nitride film is buried in the contact hole 24. Bit lines 26 extending in the memory string direction are provided on the interlayer insulating film 23 and are connected to the upper ends of the contacts 25. An interlayer insulating film 27 is provided on the interlayer insulating film 23 so as to cover the bit lines 26.

In the device 1 according to this embodiment, a memory cell formed of a MONOS-type transistor is provided for each nearest connection between the active area AA and the word-line electrode WL. A memory string has a plurality of memory cells that are arranged along the memory string direction and share the active area AA. The contacts 25 are provided in a pair for each memory string. The lower end of the contact 25 is connected to the active area AA. On the other hand, a selection transistor is provided for each nearest connection between the selection gate electrode SG and the active area AA. Thereby, the selection transistors are connected to the both ends of the memory string. Further, the plurality of active areas AA extending in the memory string direction are arranged, and the plurality of word-line electrodes WL extending in the electrode direction are arranged so as to step over these active areas AA. Thereby, a plurality of memory cells are arranged in a matrix form in the memory array unit.

Next, a method for manufacturing the nonvolatile semiconductor memory device 1 according to this embodiment will now be described.

FIGS. 5A to 13C are process cross-sectional views illustrating a method for manufacturing the nonvolatile semiconductor memory device according to this embodiment, where each drawing of the number including "A" corresponds to a cross-sectional view taken along line A-A' illustrated in FIG. 1, each drawing of the number including "B" corresponds to a cross-sectional view taken along line B-B' illustrated in FIG. 1, and each drawing of the number including "C" corresponds to a cross-sectional view taken along line C-C' illustrated in FIG. 1.

The manufacturing method according to this embodiment has a feature in fabricating-separation of the memory cell and the selection transistor. Therefore, a detailed description of the process for fabricating-separation of the memory array unit and the periphery circuit unit, and the back end process are omitted.

Figures 5A, 5B, 5C:
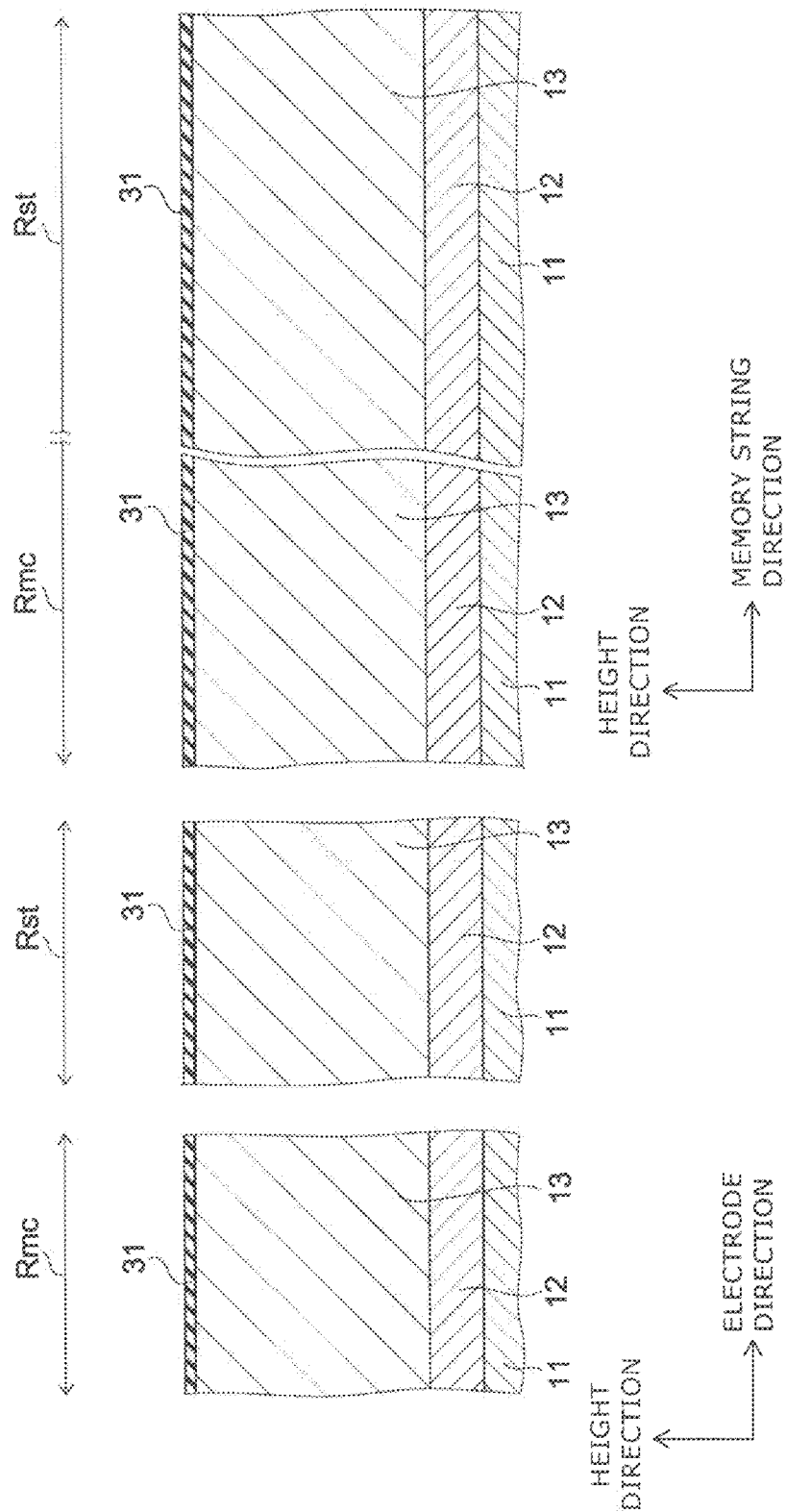

First, as illustrated in FIGS. 5A to 5C, the silicon substrate 11 is prepared. A sacrifice oxide film 31 is formed on the silicon substrate 11 by, for example, thermal oxidation. Impurities are implanted from the upper surface side of the silicon substrate 11 to form the N well 12 in the upper portion of the silicon substrate 11. Then, impurities that form the channel implants are implanted to form the P well 13 in part of the upper portion of the N well 12.

Figures 6A, 6B, 6C:
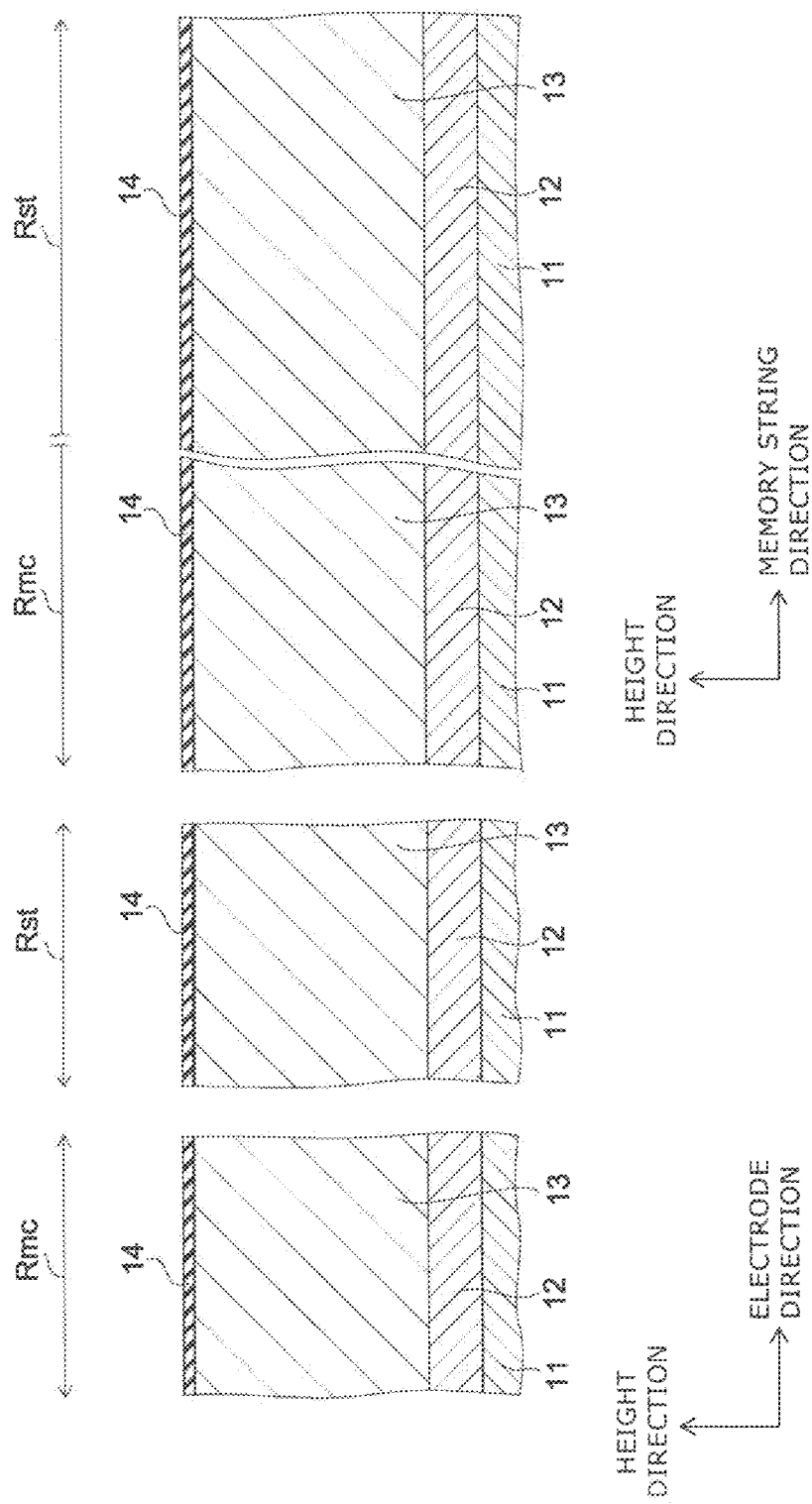

As illustrated in FIGS. 6A to 6C, the sacrifice oxide film 31 (see FIGS. 5A to 5C) is removed by using a chemical solution of hydrogen fluoride (HF) type to expose the silicon substrate 11. The tunnel insulating film 14 made of silicon oxide ($SiO_2$) with a thickness of, for example, 4 nm on the upper surface of the silicon substrate 11 is formed by a thermal oxidation treatment.

As illustrated in FIGS. 7A to 7C, silicon nitride (SiN) is deposited with a thickness of, for example, 5 nm on the tunnel insulating film 14 to form the charge storage film 15; silicon oxide is deposited with a thickness of, for example, 5 nm to form a pad oxide film 32; amorphous silicon (α-Si) is deposited with a thickness of, for example, 30 nm to form a pad silicon film 33; and silicon nitride is deposited with a thickness of, for example, 70 nm to form a pad nitride film 34.

The pad nitride film 34, the pad silicon film 33, the pad oxide film 32, the charge storage film 15, the tunnel insulating film 14, and the upper portion of the P well 13 are selectively removed by lithography to form the plurality of trenches 16 extending rectilinearly in the memory string direction. The trenches 16 are formed so as to pass from one selection transistor region Rst through the memory cell region Rmc to reach the other selection transistor region Rst.

A silicon oxide is deposited on the entire surface. Since silicon oxide is good in the properties of being buried, it is buried also in the trenches 16. The silicon oxide deposited on the pad nitride film 34 is removed by CMP (chemical mechanical polishing) using the pad nitride film 34 as a stopper. Thereby, the silicon oxide is caused to remain only in the trenches 16 to form the STIs 17. The pad nitride film 34, the pad silicon film 33, the pad oxide film 32, the charge storage film 15, and the tunnel insulating film 14 are divided in the electrode direction, and the P well 13 is partitioned into the plurality of active areas AA (semiconductor portions) extending in the memory string direction. At this point, the upper surface 17a of the STI 17 is located at the same position as the upper surface of the pad nitride film 34 in the height direction.

As illustrated in FIGS. 8A to 8C, the upper portion of the STI 17 to lower the upper surface 17a is removed by dry etching. At this time, the upper surface 17a of the STI 17 is caused to be located at a height between the upper surface and the lower surface of the pad silicon film 33 (see FIGS. 7A to 7C). The pad nitride film 34 (see FIGS. 7A to 7C) is removed by using a chemical solution of phosphoric acid type, for example, and the pad silicon film 33 is removed by using choline hydroxide, for example.

As illustrated in FIGS. 9A to 9C, a resist is applied and patterned to form a resist film 35 that covers the selection transistor regions Rst. Dry etching is performed by using this resist film 35 as a mask to further remove the upper portions of the STIs 17 in the memory cell region Rmc to further lower the upper surfaces 17a. That is, the upper portions of the middle portion of the STIs 17 in the memory string direction, that is, the portion located in the memory cell region Rmc, are further removed. At this time, the upper surface 17a of the STI 17 in the memory cell region Rmc is caused to be located at the same height as the upper surface 15a of the charge storage film 15, for example. The resist film 35 is removed. Thus, the configuration in which the height of the upper surface 17a of the STI 17 is different between the selection transistor region Rst and the memory cell region Rmc can be obtained.

As illustrated in FIGS. 10A to 10C, the pad oxide film 32 (see FIGS. 9A to 9C) is removed by using a chemical solution of hydrogen fluoride (HF) type. An alumina ($Al_2O_3$) is deposited with a thickness of, for example, 10 nm to form the block insulating film 18. Since the block insulating film 18 is film-formed by deposition, it is film-formed with an approximately uniform film thickness so as to cover the charge storage film 15 and the STIs 17. Thereby, in the memory cell region Rmc, since the upper surface 15a of the charge storage film 15 and the upper surfaces 17a of the STIs 17 form a nearly continuous flat surface, the block insulating film 18 also is film-formed flatly. On the other hand, in the selection transistor region Rst, since the STI 17 protrudes from the upper surface 15a of the charge storage film 15, the block insulating film 18 is film-formed to be curved along the protruding portions of the STIs 17. A conductivity polysilicon doped with impurities is deposited with a thickness of, for example, 50 nm to form the polysilicon film 19, and silicon nitride is deposited with a thickness of, for example, 70 nm to form a cap nitride film 36.

Figures 11A, 11B, 11C:
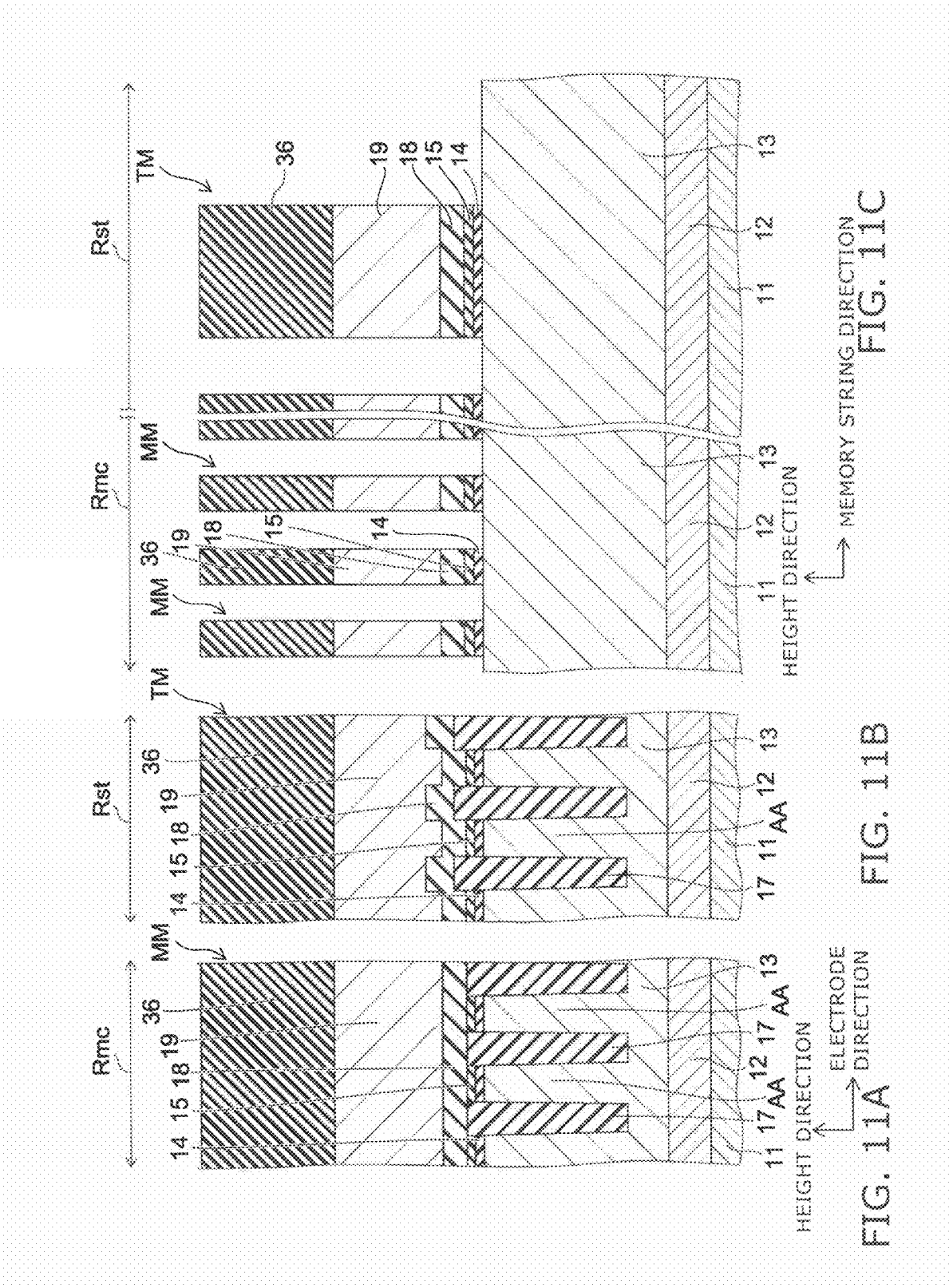

As illustrated in FIGS. 11A to 11C, the cap nitride film 36, the polysilicon film 19, the block insulating film 18, the charge storage film 15, and the tunnel insulating film 14 are selectively removed by lithography to be divided in the memory string direction. Thereby, the plurality of memory cell stacked bodies MM extending in the electrode direction are formed in the memory cell region Rmc, and the selection transistor stacked bodies TM extending in the electrode direction are formed in a pair of selection transistor regions Rst on both sides of the memory cell region Rmc.

Impurities into the regions in the P well 13 immediately below the selection transistor stacked bodies TM are implanted from an oblique direction with adjustment of the implantation angle by ion-implantation method. Thereby, the threshold of the selection gate transistor is adjusted to a value different from the threshold of the transistor that forms the memory cell.

As illustrated in FIGS. 12A to 12C, silicon oxide is film-formed with a thickness of, for example, 4 nm by using a film-formation technique such as ALD (atomic layer deposition). The source/drain diffusion layers 21 is formed by the implantation using the memory cell stacked bodies MM and the transistor stacked bodies TM as a mask. A silicon oxide is deposited with a thickness of approximately 9 nm, for example, and is further deposited with a thickness of 50 nm, for example. The deposited silicon oxide film is processed by dry etching. Thereby, the silicon oxide film is buried between the memory cell stacked bodies MM and remains on the side surfaces of the memory cell stacked bodies MM disposed on the outermost sides and on the side surfaces of the transistor stacked bodies TM. Side walls 37 are formed between the strip-shaped stacked bodies and on the side surfaces of the strip-shaped stacked bodies.

Figures 13A, 13B, 13C:
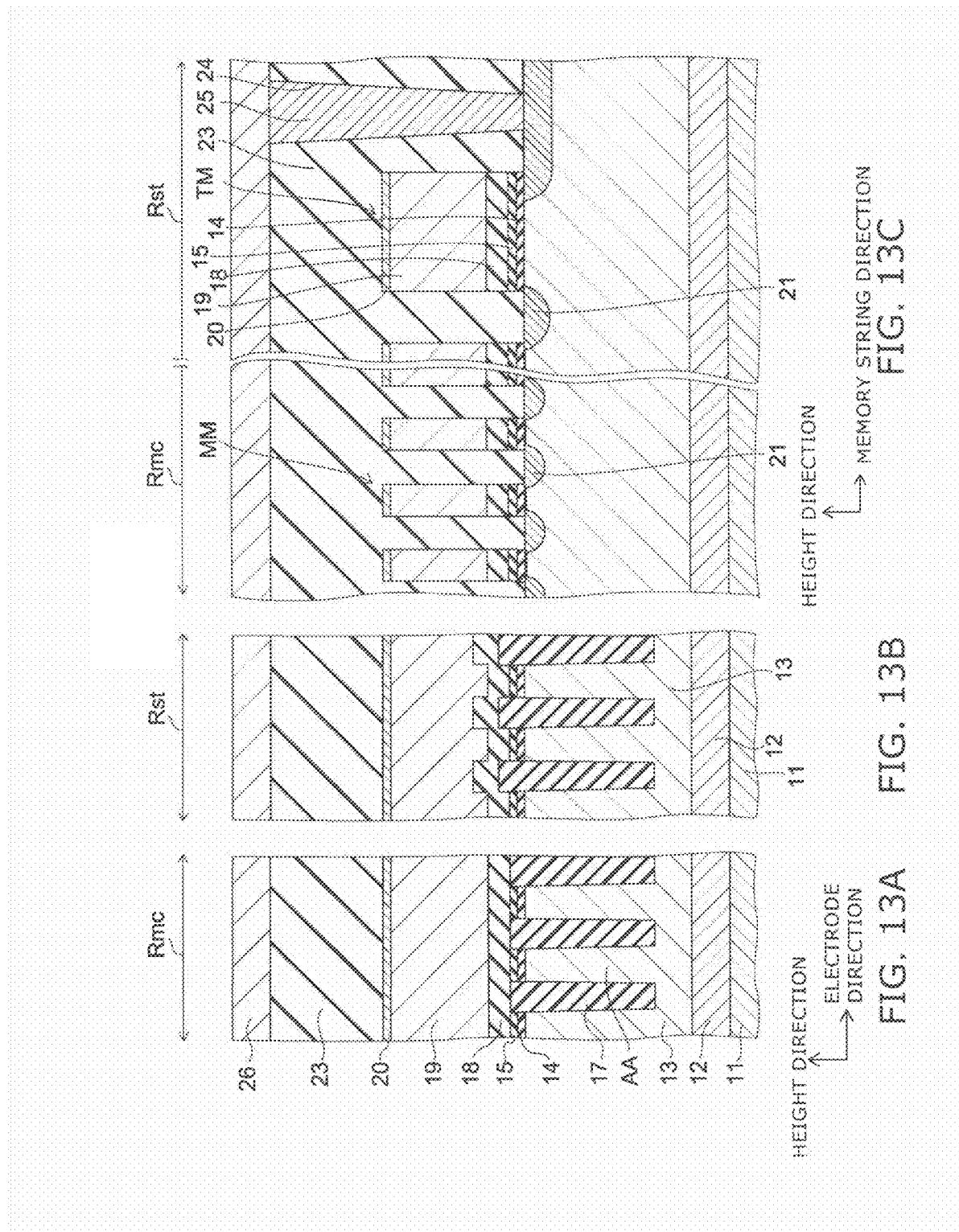

As illustrated in FIGS. 13A to 13C, a resist film (not illustrated) having openings in which the contacts are to be formed is formed by lithography, and impurities are implanted into the silicon substrate 11 by using this resist film as a mask. The resist film is removed, and a heat treatment (activation anneal) for activating the implanted impurities is performed.

Silicon oxide is deposited with a thickness of, for example, 7 nm and silicon nitride is deposited with a thickness of, for example, 20 nm by LP-CVD (low pressure chemical vapor deposition), for example, to form a liner material (not illustrated) between the selection gate electrodes SG. The regions between the strip-shaped stacked bodies are filled with a silicon oxide film that is good in the properties of being buried, and CMP is performed by using the cap nitride film 36 as a stopper. Then, dry etching is performed to remove the cap nitride film 36 and expose the polysilicon film 19. Next, cobalt (Co) is deposited by sputtering, and an anneal is performed to alloy the cobalt with the upper portion of the polysilicon film 19 to form the alloy layer 20 made of cobalt silicide. Thereby, the word-line electrodes WL formed of the polysilicon film 19 and the metal layer 20 and extending in the electrode direction are formed in the memory cell region Rmc, and the selection gate electrode SG formed of the polysilicon film 19 and the metal layer 20 and extending in the electrode direction is formed in the selection transistor region Rst.

Silicon oxide is deposited with a thickness of, for example, 50 nm, silicon nitride is deposited with a thickness of, for example, 30 nm, and silicon oxide is deposited with a thickness of, for example, 350 nm by PECVD (plasma enhanced CVD), for example. Thereby, the interlayer insulating film 23 is formed. In FIGS. 13A to 13C and FIGS. 1 to 4, it is assumed that the side walls 37 (see FIGS. 12A to 12C) are included in the interlayer insulating film 23, and their illustrations are omitted.

The contact holes 24 reaching the silicon substrate 11 are formed in the interlayer insulating film 23 by lithography. Then, a titanium nitride film (not illustrated) with a thickness of 5 nm, for example, is formed on the inner surface of the contact hole 24, and the inside of the contact hole 24 is filled with a metal such as tungsten (W). Thereby, the contact 25 is formed in the contact hole 24. The bit lines 26 are formed on the interlayer insulating film 23 so as to be connected to the contacts 25. The interlayer insulating film 27 is further formed on the interlayer insulating film 23 so that the bit lines 26 may be embedded in the interlayer insulating film 27. Thereby, as illustrated in FIGS. 1 to 4, the nonvolatile semiconductor memory device 1 according to this embodiment is manufactured.

The operation and effects of this embodiment will now be described.

Figures 14A, 14B:
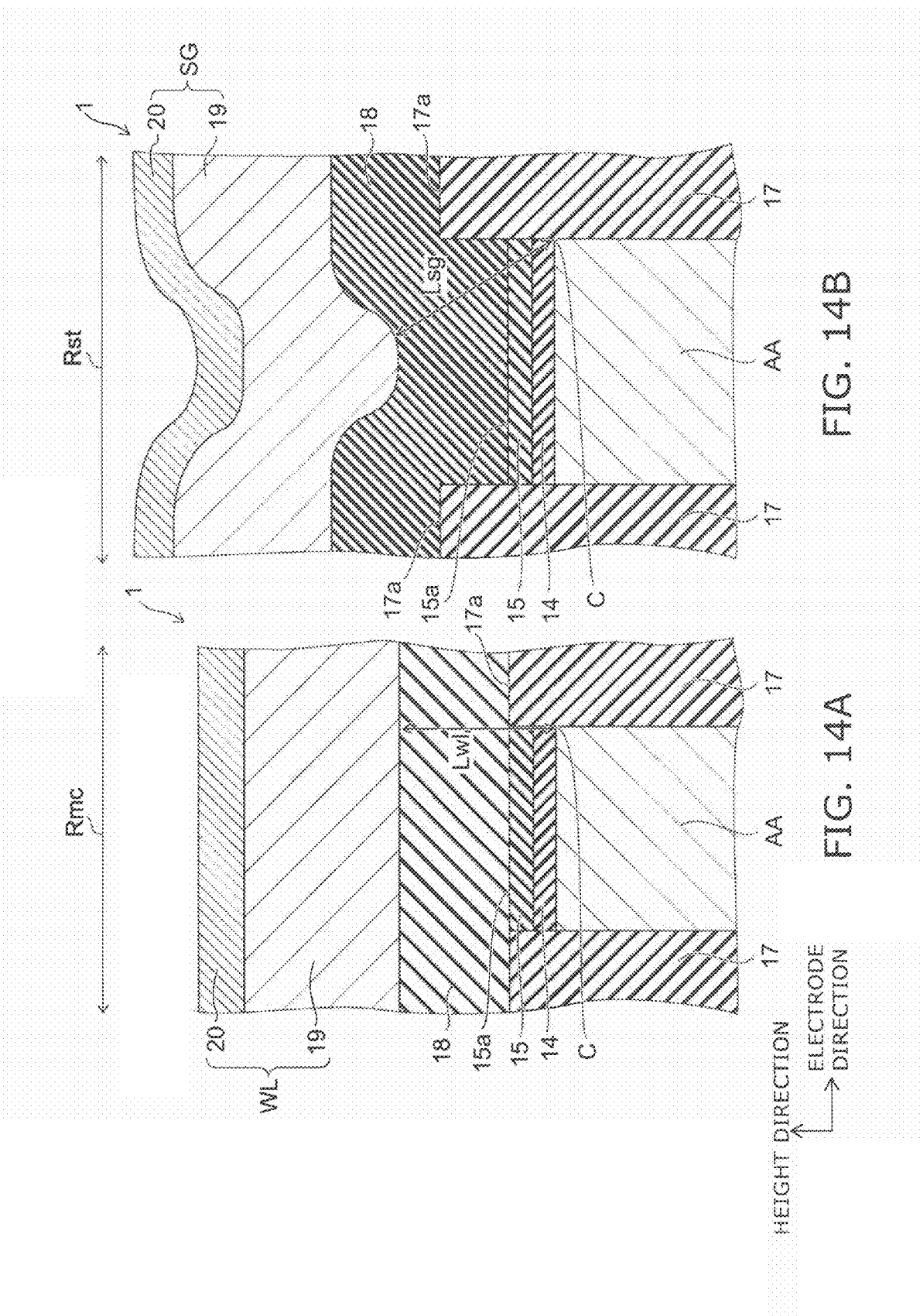
FIGS. 14A and 14B are cross-sectional views illustrating the operation and effects of the first embodiment, where

FIGS. 14A and 14B are cross-sectional views illustrating the operation and effects of this embodiment, where FIG. 14A illustrates the memory cell region Rmc, and FIG. 14B illustrates the selection transistor region Rst.

As illustrated in FIGS. 14A and 14B, in the nonvolatile semiconductor memory device 1 according to this embodiment, the upper surface 17a of the STI 17 in the selection transistor region Rst is located higher than the upper surface 17a of the STI 17 in the memory cell region Rmc. Thereby, in the selection transistor region Rst, the block insulating film 18 is curved to reflect the shape of the STIs 17, and the regions in the lower surface of the selection gate electrode SG immediately above the STIs 17 are concave upward. Accordingly, in a cross section parallel to the electrode direction and the height direction, the shortest distance Lsg between a corner portion C of the active area AA and the selection gate electrode SG is longer than the shortest distance Lwl between the corner portion C of the active area AA and the word-line electrode WL.

Consequently, the electric field applied between the corner portion C of the active area AA and the selection gate electrode SG is weaker than the electric field applied between the corner portion C of the active area AA and the word-line electrode WL, and the electric field applied to the end portion of the charge storage film 15 also is weaker in the selection transistor region Rst than in the memory cell region Rmc. Thereby, in the selection transistor, even if a voltage is applied between the selection gate electrode SG and the active area AA, it is difficult to inject a charge into the end portion of the charge storage film 15. Consequently, the threshold of the selection transistor becomes difficult to vary, and the operation of the selection transistor gets stable.

It may be possible to separately fabricate the gate insulating film of the selection transistor and the gate insulating film of the memory cell transistor and to configure the gate insulating film of the selection transistor to have the same configuration as the gate insulating film of the transistor of the peripheral circuit, that is, the configuration not including a charge storage film such as a single-layer silicon oxide film. However, since the distance between the selection transistor and the memory cell transistor is short, if the gate insulating films for the selection transistor and the memory cell transistor are fabricated-separated, it is difficult to form the gate insulating films of both transistors with aimed film thicknesses due to process variation. In contrast, this embodiment enables to suppress a variation in the threshold of the selection transistor, while making the configuration of the gate insulating film uniform for both the selection transistor and the memory cell transistor.

Next, a first variation example of this embodiment will now be described.

FIGS. 15A and 15B are cross-sectional views illustrating a nonvolatile semiconductor memory device according to this variation example, where FIG. 15A illustrates the memory cell region Rmc, and FIG. 15B illustrates the selection transistor region Rst.

As illustrated in FIGS. 15A and 15B, a nonvolatile semiconductor memory device 1a according to this variation example has different configurations of the tunnel insulating film, the STI, and the electrode from the device 1 (see FIGS. 13A to 13C) according to the first embodiment described above.

That is, in the memory cell region Rmc of the device 1a, the upper surface 17a of the STI 17 is located at a height lower than the upper surface 15a of the charge storage film 15 and higher than the lower surface 15b thereof at the connection with the charge storage film 15, and at nearly the same height as the lower surface 15b in the central portion of the STI 17 in the electrode direction. On the other hand, in the selection transistor region Rst, the upper portion of the STI 17 has the cross-sectional shape of a trapezoid. The connection between the STI 17 and the charge storage film 15 is located at nearly the same position in both the memory cell region Rmc and the selection transistor region Rst. The configuration other than the above of this variation example is similar to the first embodiment described above. That is, in this variation example also, the shortest distance Lsg between the corner portion of the active area AA and the selection gate electrode SG is longer than the shortest distance Lwl between the corner portion of the active area AA and the word-line electrode WL.

Next, the operation and effects of this variation example will now be described.

FIGS. 16A and 16B are schematic cross-sectional views illustrating simulation results of the electric field distribution in the nonvolatile semiconductor memory device according to this variation example by inside simulator. FIG. 16A illustrates the memory cell region Rmc, and FIG. 16B illustrates the selection transistor region Rst.

FIGS. 16A and 16B illustrate the same regions as the FIGS. 15A and 15B, respectively, and lines other than the lines representing the boundaries between the films and the lead lines out of the lines in the drawings represent equipotential surfaces. The gradation in the drawings represents the intensity of electric field, where the darker the color is, the stronger the electric field is.

As illustrated in FIGS. 16A and 16B, in the device 1a according to this variation example, the electric fields applied to the end portion of the active area AA and the end portion of the charge storage film 15 are weaker in the selection transistor region Rst than in the memory cell region Rmc. Thereby, similarly to the first embodiment described above, it is difficult to inject a charge into the charge storage film 15 of the selection transistor, and the threshold of the selection transistor becomes difficult to vary.

Next, a second variation example of this embodiment will now be described.

Figure 17:
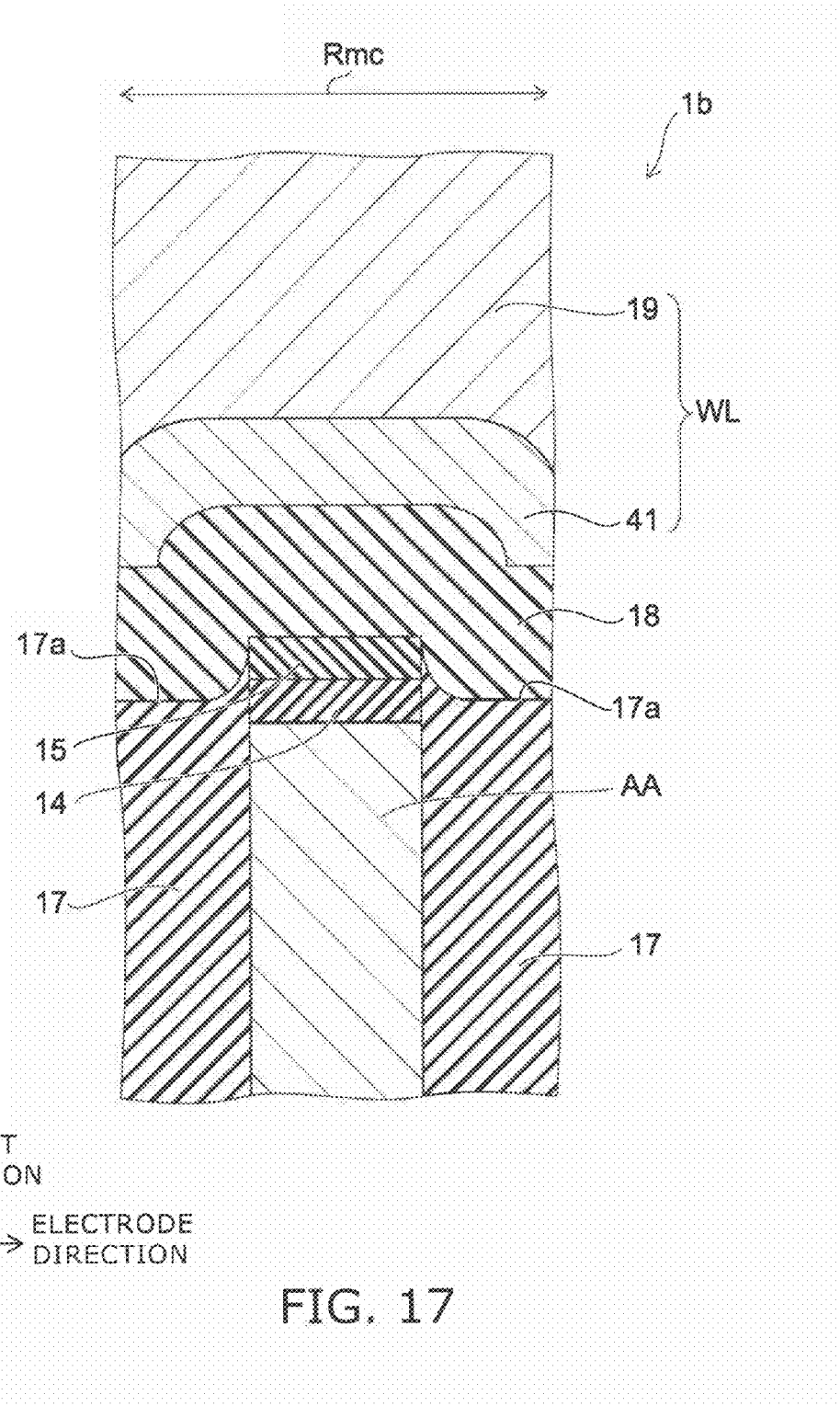
FIG. 17 is a cross-sectional view illustrating a nonvolatile semiconductor memory device according to a second variation example of the first embodiment.

FIG. 17 is a cross-sectional view illustrating a nonvolatile semiconductor memory device according to this variation example.

FIG. 17 illustrates the cross section of the memory cell region Rmc parallel to the electrode direction, that is, the cross section corresponding to FIG. 2A.

As illustrated in FIG. 17, in a nonvolatile semiconductor memory device 1b according to this variation example, the upper surface 17a of the STI 17 is located low compared to the device 1 (see FIG. 2A) according to the first embodiment described above. That is, in the device 1b, the upper surface 17a of the STI 17 is located lower than the lower surface of the charge storage film 15 at least in the memory cell region Rmc.

Specifically, the upper surface 17a is located lower than the upper surface of the tunnel insulating film 14 and higher than the lower surface thereof. Further, in the device 1b, a metal film 41 made of, for example, tantalum nitride (TaN) is provided in the lower portions of the word-line electrode WL and the selection gate electrode SG. The device 1b can be manufactured by lowering the upper surface 17a of the STI 17 to a lower position than the upper surface of the tunnel insulating film 14 in the process illustrated in FIGS. 9A to 9C, and then film-forming the block insulating film 18 and film-forming the metal film 41 in the process illustrated in FIGS. 10A to 10C. The configuration and manufacturing method for this variation example other than the above are similar to the first embodiment described above.

Next, the operation and effects of this variation example will now be described.

In the device 1b according to this variation example, the upper surface 17a of the STI 17 is located low compared to the device 1 according to the first embodiment described above. More specifically, the upper surface 17a of the STI 17 is located lower than the lower surface of the charge storage film 15, and therefore the position of the block insulating film 18 that is a high dielectric constant film is lowered to near the through-thickness center of the tunnel insulating film 14. Thereby, the shortest distance between the tunnel insulating film 14 and the word-line electrode WL get shortened, and the upper portion of the tunnel insulating film 14 is placed between the block insulating films 18. Consequently, a stronger electric field can be applied to the tunnel insulating film 14 at the time of programming operation and erasing operation. Thereby, compared to the first embodiment described above, in the case where programming and erasing are performed at the same voltage, the programming speed and erasing speed can be increased and the range of the threshold voltage of memory cell can be expanded.

Conversely, in the case where the range of the threshold voltage is made the same, the programming voltage and erasing voltage can be made lower than the first embodiment. This can relax the stresses given to the tunnel insulating film 14 and the block insulating film 18 at the time of programming operation and erasing operation. Consequently, the device 1b can suppress a degradation of the tunnel insulating film 14 and the block insulating film 18 even if programming and erasing are repeated, and prevent the charge stored in the charge storage film 15 from de-trapping away via the tunnel insulating film 14 or the block insulating film 18. That is, data retention characteristics after repeating programming and erasing can be improved. The operation and effects of this variation example other than the above are similar to the first embodiment described above.

Next, these effects will now be described with reference to specific data.

In the following, a description will be given by comparing the device 1 (see FIG. 2A) according to the first embodiment described above, that is, a device in which the upper surface of the STI is located higher than the upper surface of the tunnel insulating film, and the device 1b (see FIG. 17) according to this variation example, that is, a device in which the upper surface of the STI is located lower than the lower surface of the charge storage film.

First, the intensity of the electric field applied to the tunnel insulating film at the time of programming operation will now be compared.

Figure 18B:
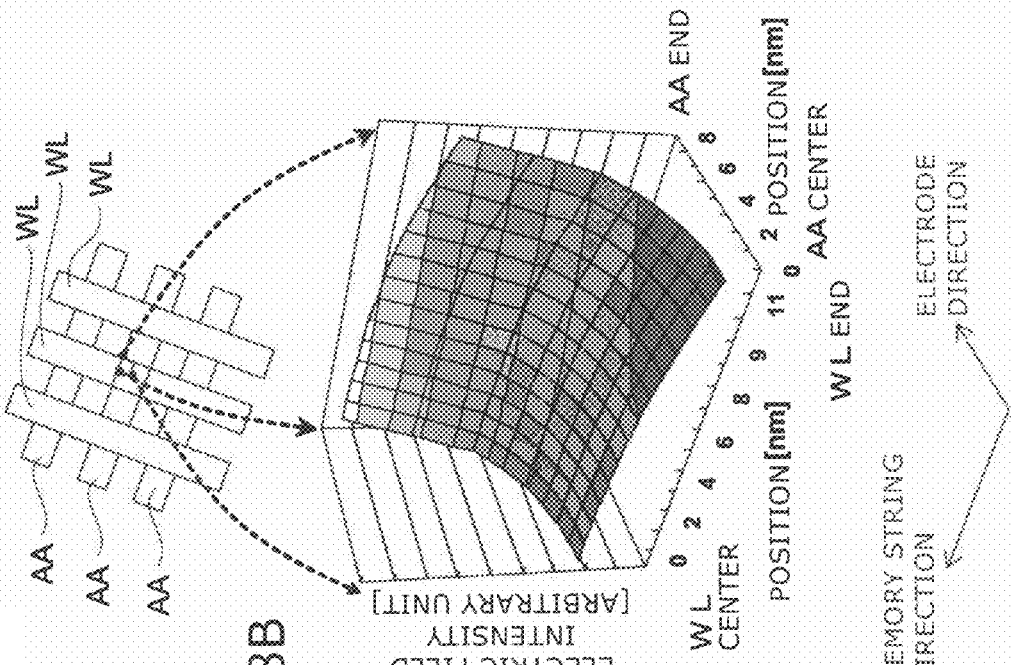
FIGS. 18A and 18B are three-dimensional graphs illustrating the electric field intensity in a tunnel insulating film, where
Figure 18A:
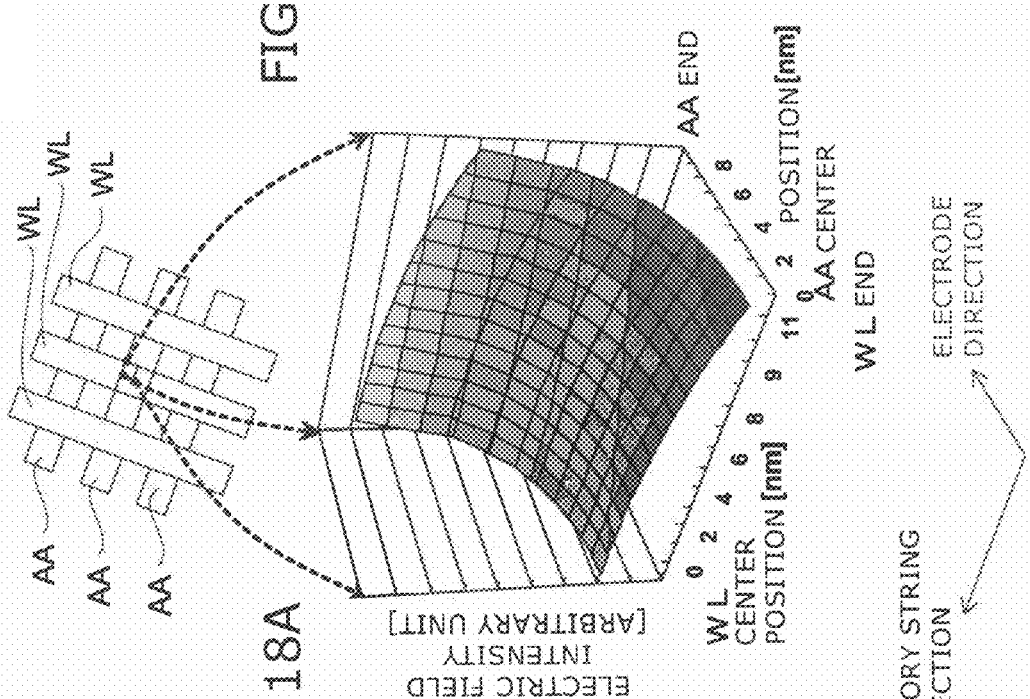

FIGS. 18A and 18B are three-dimensional graphs illustrating the electric field intensity in the tunnel insulating film, where FIG. 18A illustrates the device according to the first embodiment, and FIG. 18B illustrates the device according to this variation example.

FIGS. 18A and 18B illustrate the tunnel insulating film belonging to one memory cell, that is, the portion located in the tunnel insulating film 14 provided on one active area AA and immediately below one word-line electrode WL, and illustrate simulation results of the intensity of the electric field applied in case the same programming voltage is applied, in regard to a quarter region of the whole tunnel insulating film belonging to one memory cell. The gradation illustrated in FIGS. 18A and 18B indicates that the lighter the color is, the stronger the electric field intensity is.

As illustrated in FIGS. 18A and 18B, in case the same programming voltage is applied, a stronger electric field is applied to the tunnel insulating film in this variation example than in the first embodiment. As an example, in case the programming voltage is 17 V, the average intensity of the electric field applied to the tunnel insulating film was 12.8 MV/cm in the first embodiment and 13.3 MV/cm in this variation example.

Next, programming characteristics and erasing characteristics will now be compared.

Figure 19A:
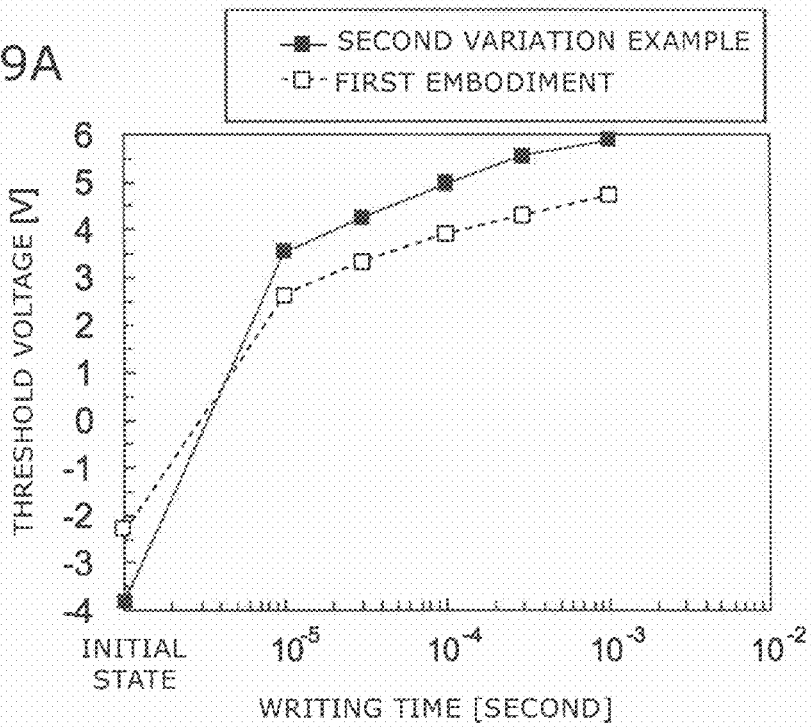
FIGS. 19A and 19B are graphs illustrating characteristics of memory cell with the time on the horizontal axis and the threshold voltage on the vertical axis, where
Figure 19B:
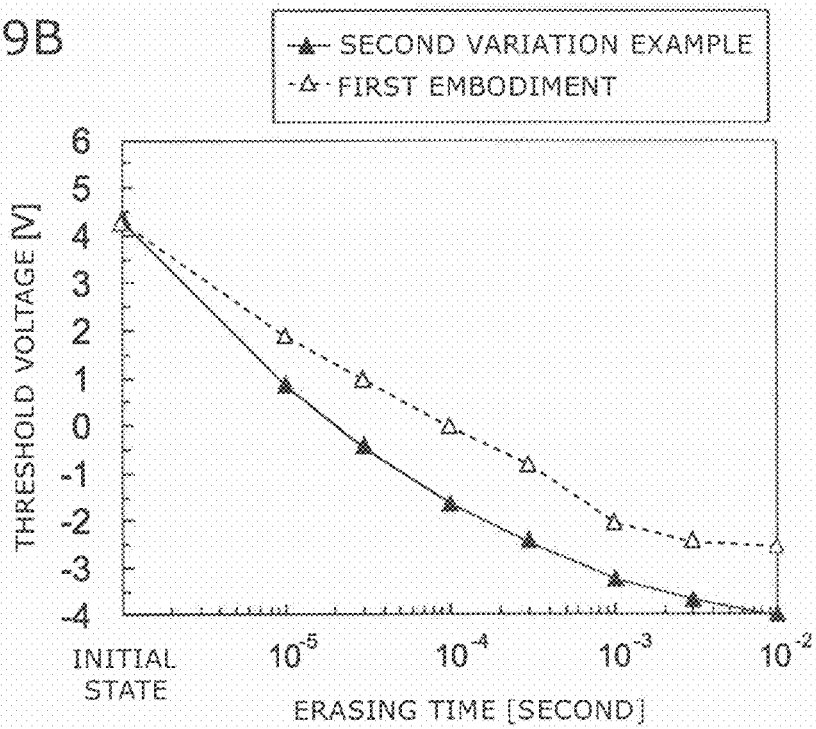

FIGS. 19A and 19B are graphs illustrating characteristics of memory cell with the time on the horizontal axis and the threshold voltage on the vertical axis, where FIG. 19A illustrates programming characteristics, and FIG. 19B illustrates erasing characteristics.

Further, FIG. 19A illustrates in case a programming voltage of 18 V is applied, and FIG. 19B illustrates the case where an erasing voltage of 17 V is applied.

As illustrated in FIG. 19A, in case the programming voltage is the same, the threshold voltage of memory cell changes rapidly in the device according to this variation example compared to the device according to the first embodiment. That is, the programming speed is fast. Furthermore, the amount of threshold voltage change is large in this variation example. Similarly, as illustrated in FIG. 19B, in case the erasing voltage is the same, the erasing speed is fast and the amount of threshold voltage change is large in the device according to this variation example compared to the device according to the first embodiment.

Next, data retention characteristics will now be compared.

Figure 20A:
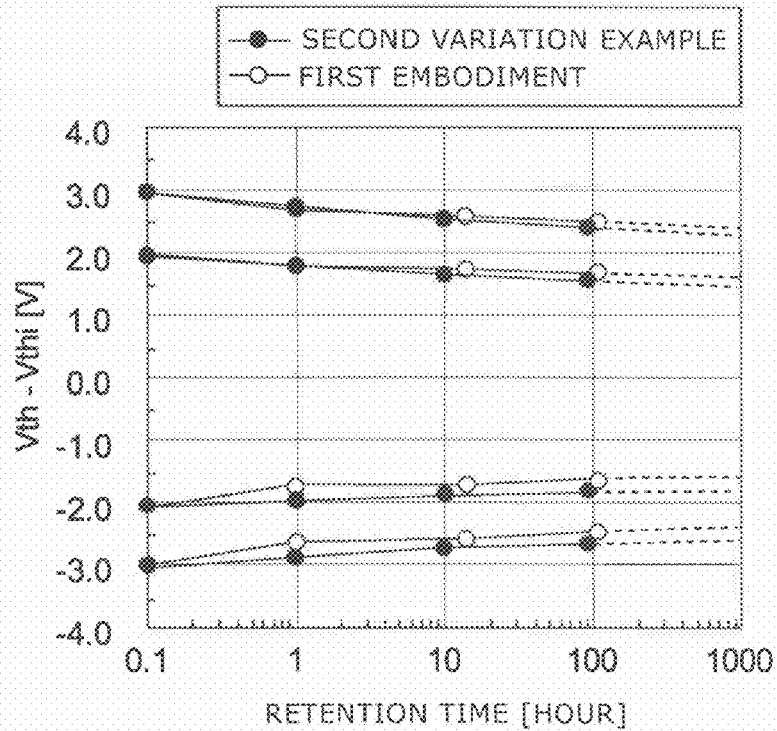
FIGS. 20A and 20B are graphs illustrating data retention characteristics of memory cell with the retention time on the horizontal axis and the width of threshold voltage change on the vertical axis.
Figure 20B:
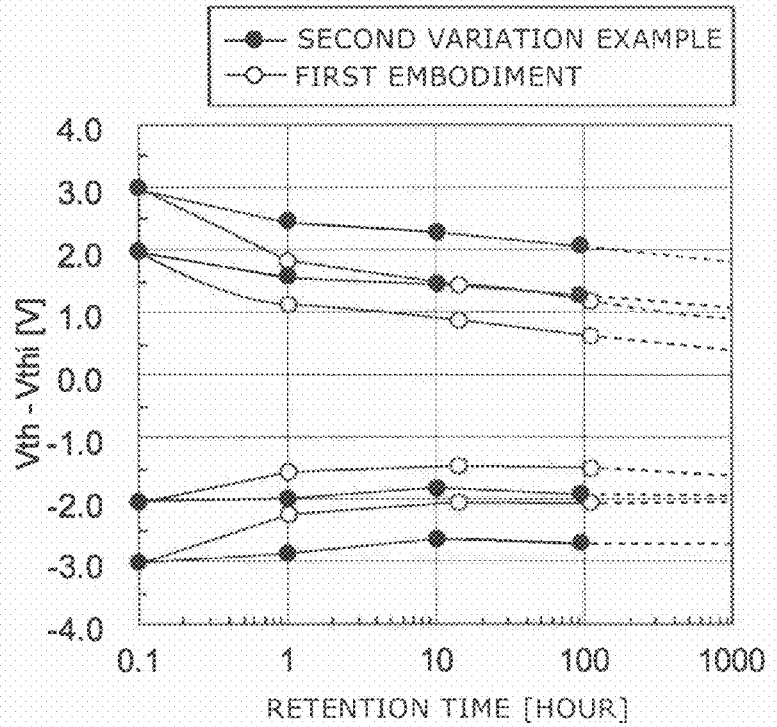

FIGS. 20A and 20B are graphs illustrating data retention characteristics of memory cell with the retention time on the horizontal axis and the width of threshold voltage change on the vertical axis.

The horizontal axes of FIGS. 20A and 20B represent the time of keeping the device at a temperature of 85° C. FIG. 20A illustrates test results for the device in the state where the stress of programming/erasing is not provided, and FIG. 20B illustrates test results for the device after a programming/erasing cycle with a threshold range of −2 V to +2 V is performed 1200 times.

As illustrated in FIG. 20A, in the state before the stress of programming/erasing was not given, the data retention characteristics of the device according to this variation example was nearly the same as the data retention characteristics of the device according to the first embodiment. However, as illustrated in FIG. 20B, in the state after the stress of programming/erasing was given, data retention characteristics was good in the device according to this variation example compared to the device according to the first embodiment.

As shown in the above test results, in regard to the device according to this variation example in comparison with the device according to the first embodiment described above, in case the programming voltage and the erasing voltage are the same, the electric field applied to the tunnel insulating film is strong; therefore, the programming operation speed and the erasing operation speed are rapid, and the range of threshold voltage change is broad. Also, in case the range of threshold voltage change is the same, the data retention characteristics are good. Next, a second embodiment of the invention will now be described.

Figure 21:
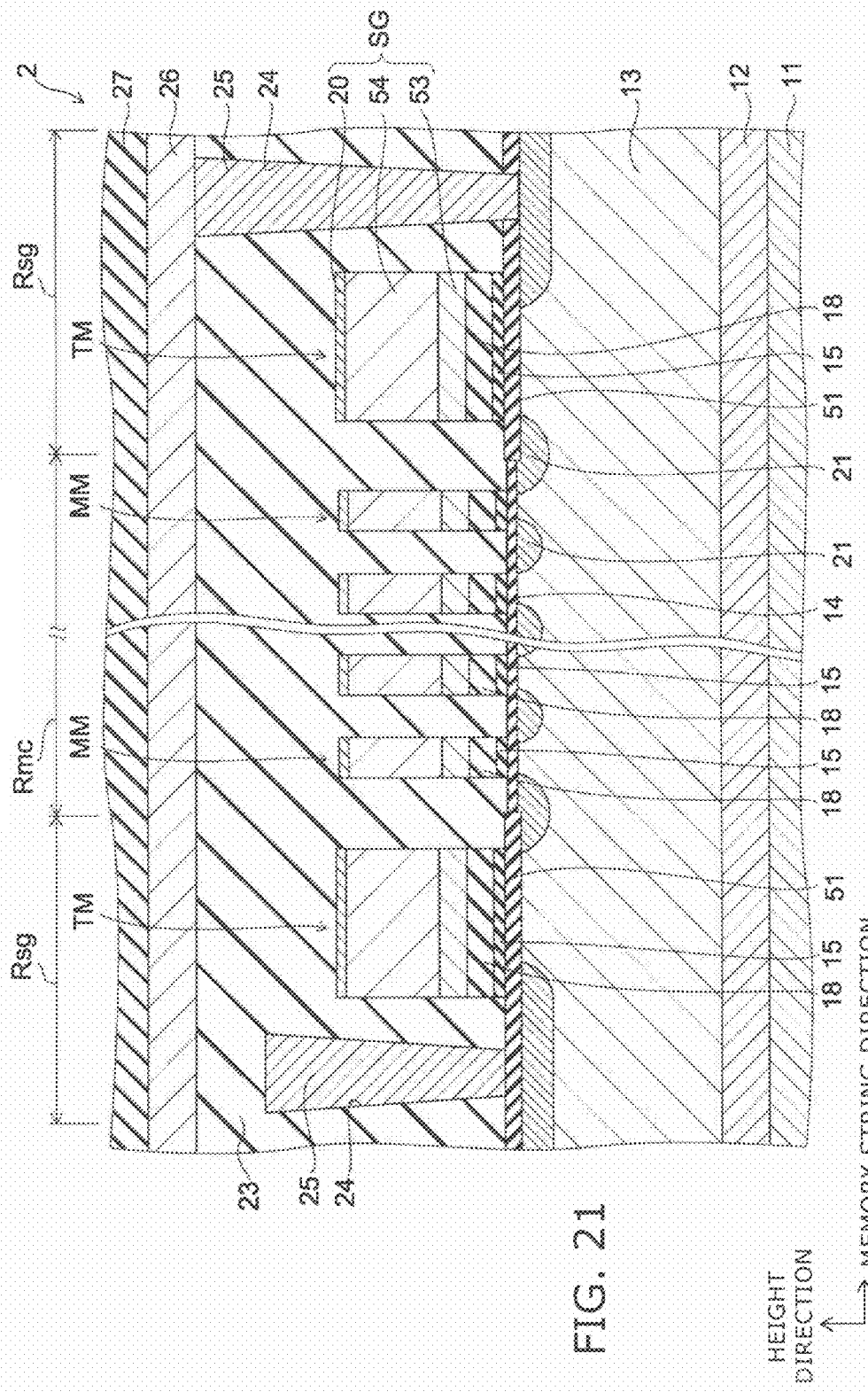
FIG. 21 is a cross-sectional view parallel to a memory string direction and illustrates a nonvolatile semiconductor memory device according to a second embodiment.

FIG. 21 is a cross-sectional view parallel to the memory string direction and illustrates a nonvolatile semiconductor memory device according to this embodiment.

Figures 22A, 22B:
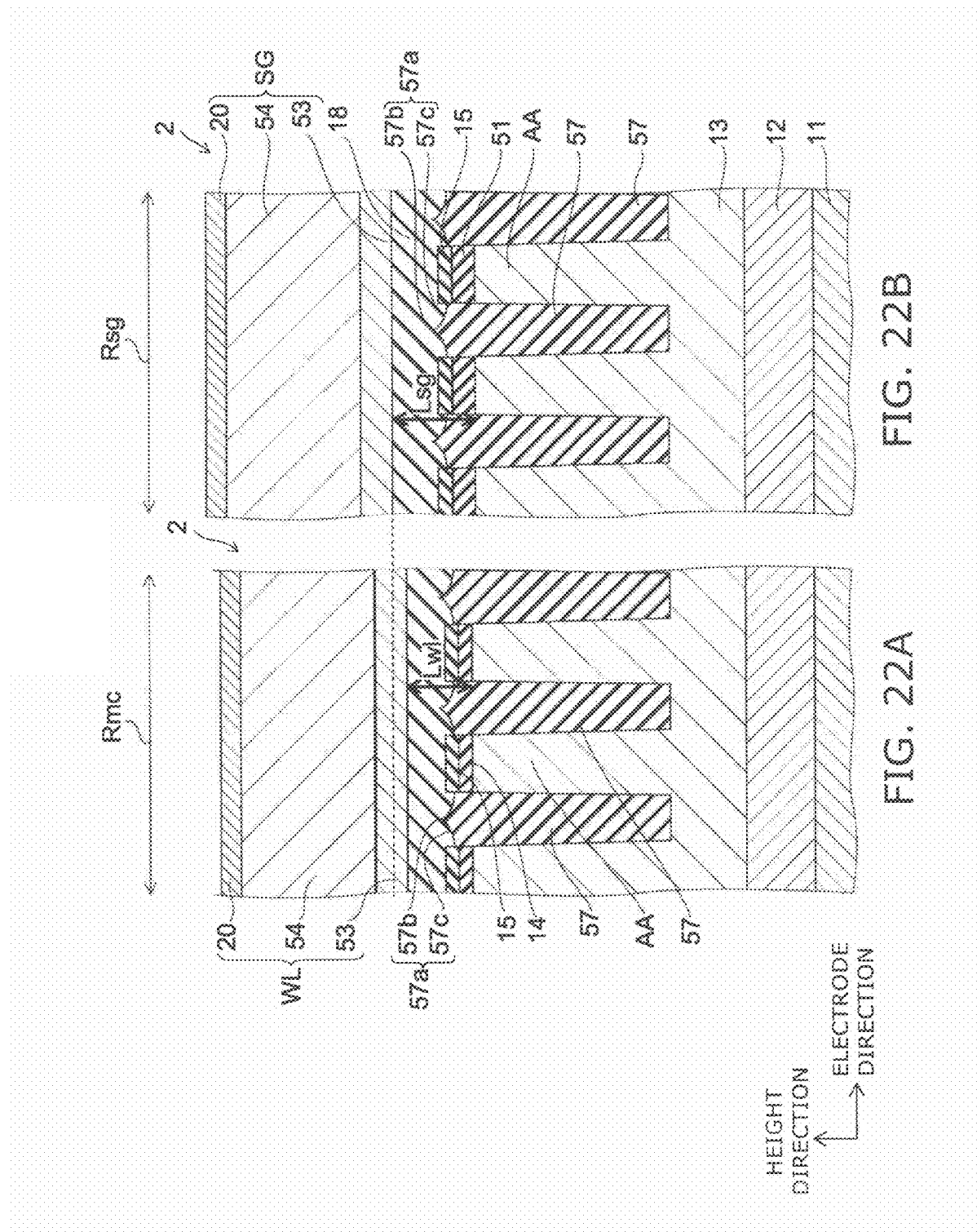
FIGS. 22A and 22B are cross-sectional views parallel to an electrode direction and illustrates the nonvolatile semiconductor memory device according to the second embodiment, where
Figures 23A, 23B, 23C, 23D, 23E:
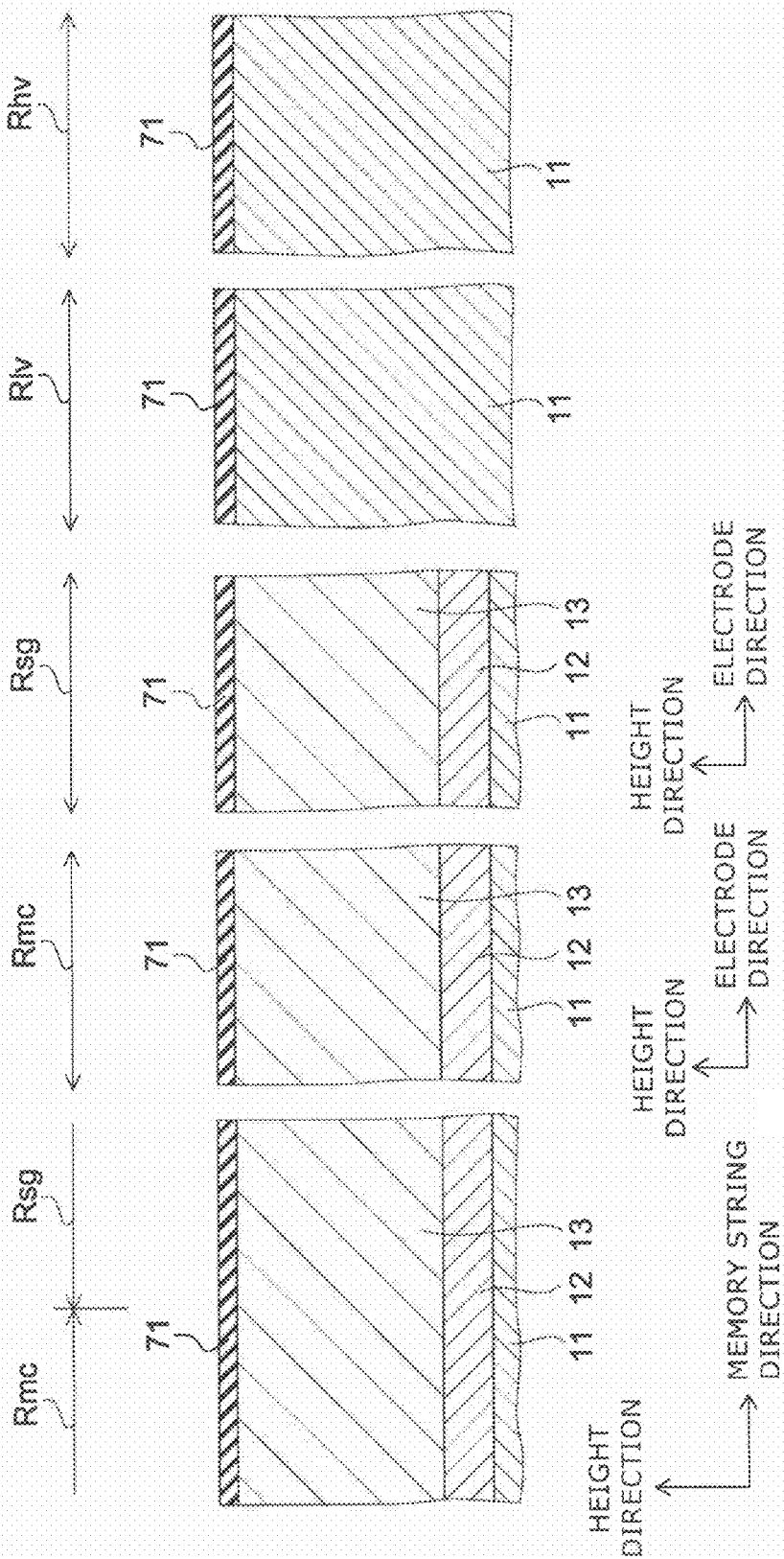
Figures 25A, 25B, 25C, 25D, 25E:
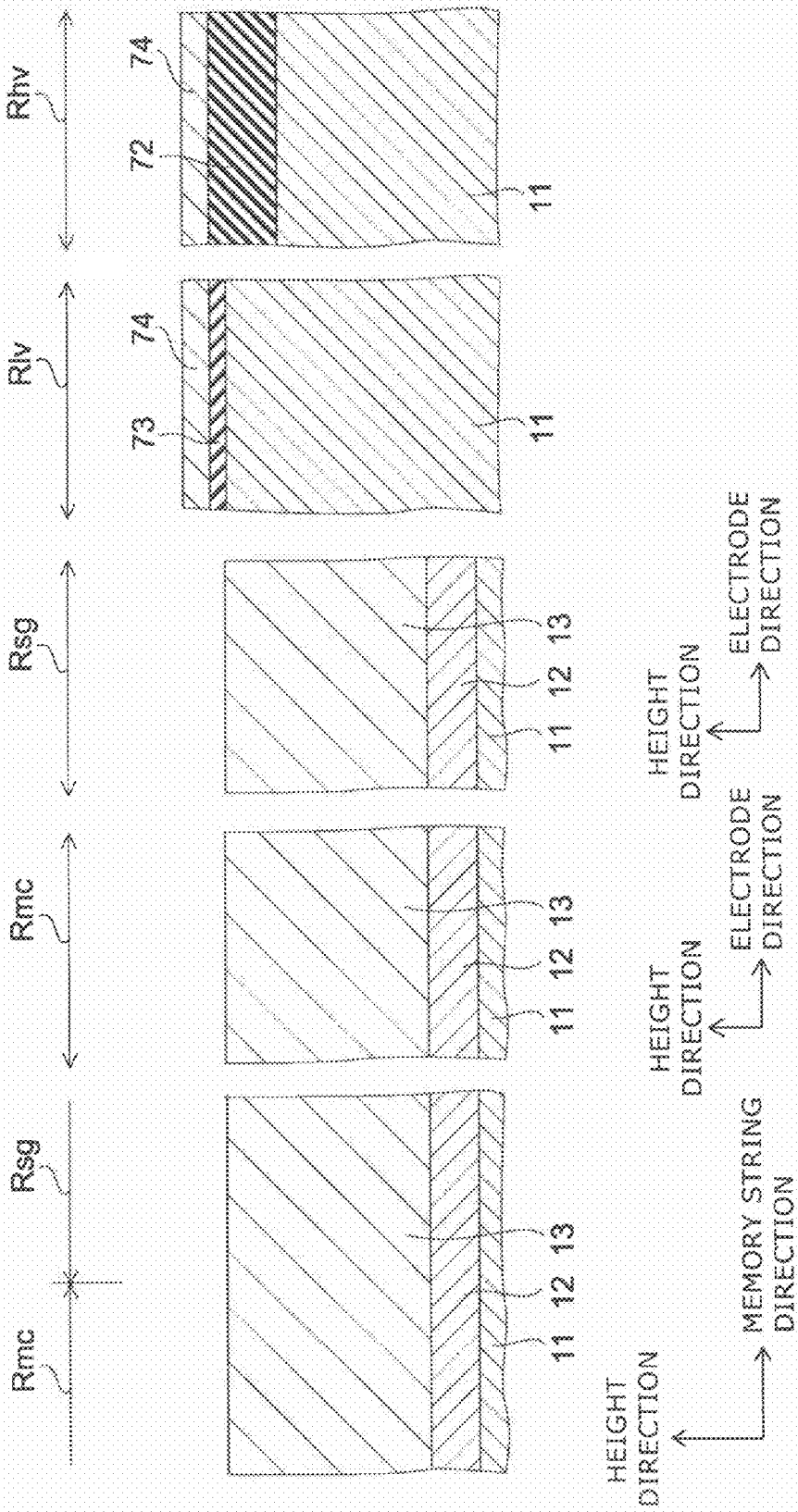
Figures 28A, 28B, 28C, 28D, 28E:
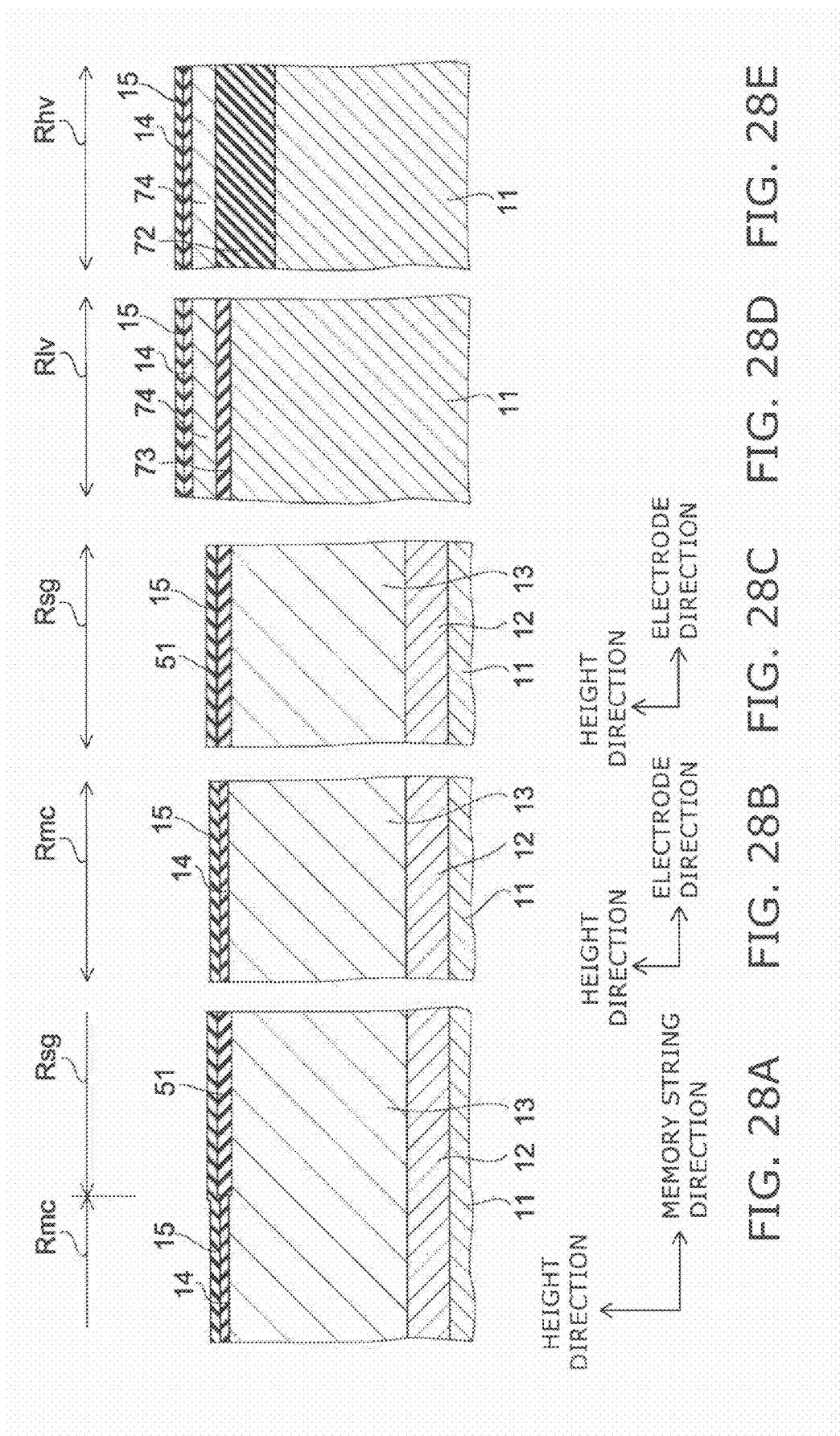
Figures 30A, 30B, 30C, 30D, 30E:
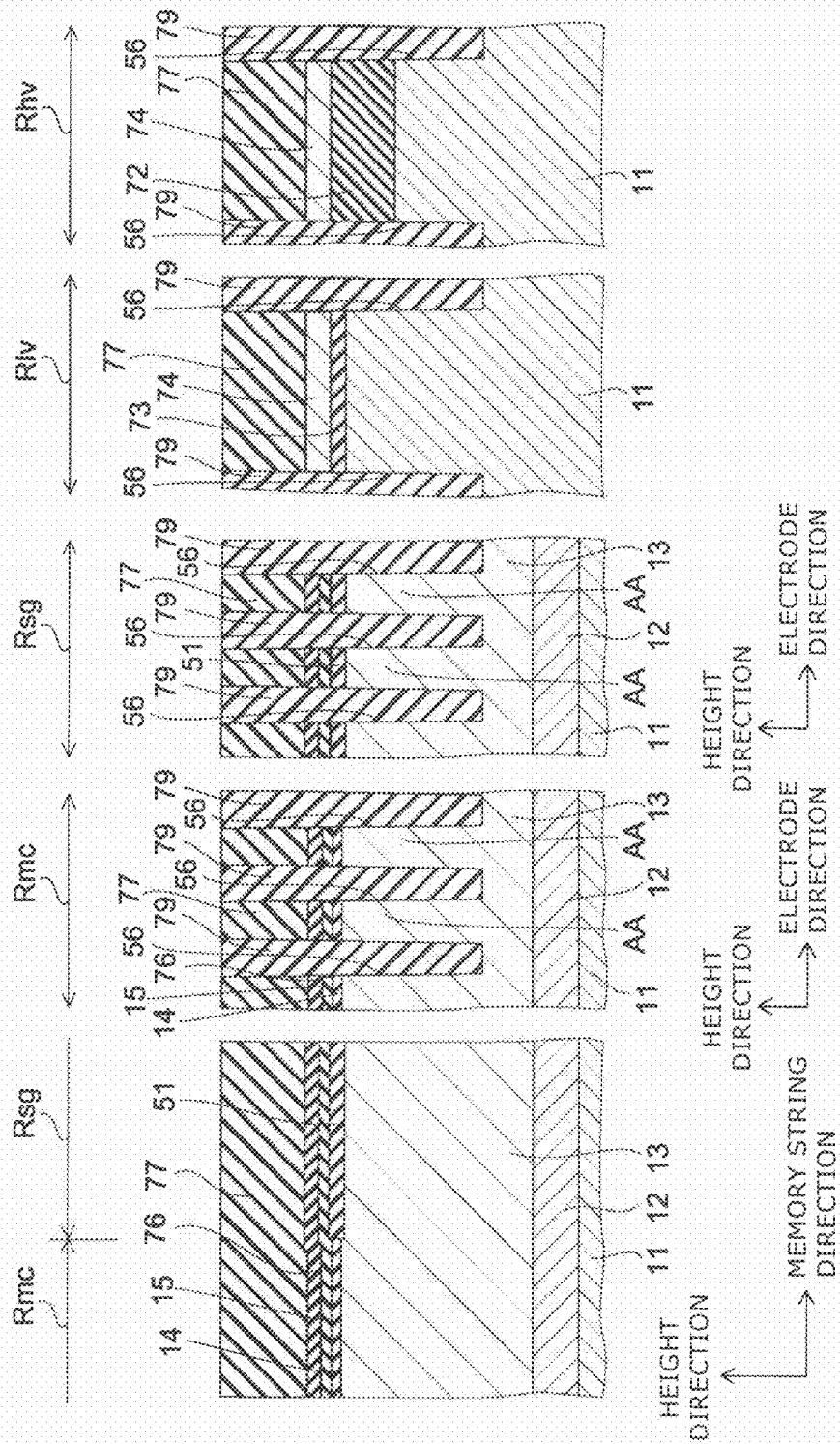
Figures 33A, 33B, 33C, 33D, 33E:
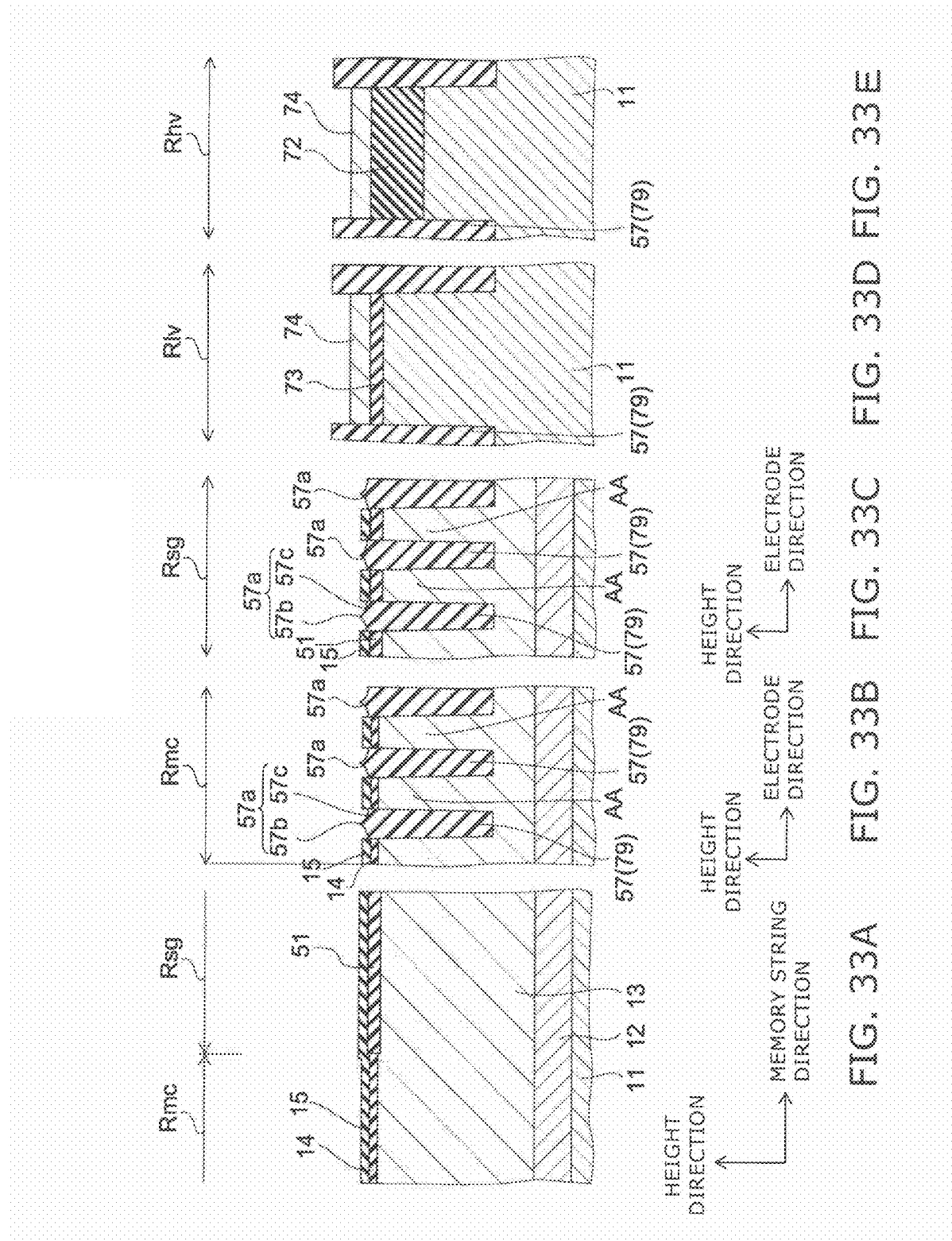
Figures 34A, 34B, 34C, 34D, 34E:
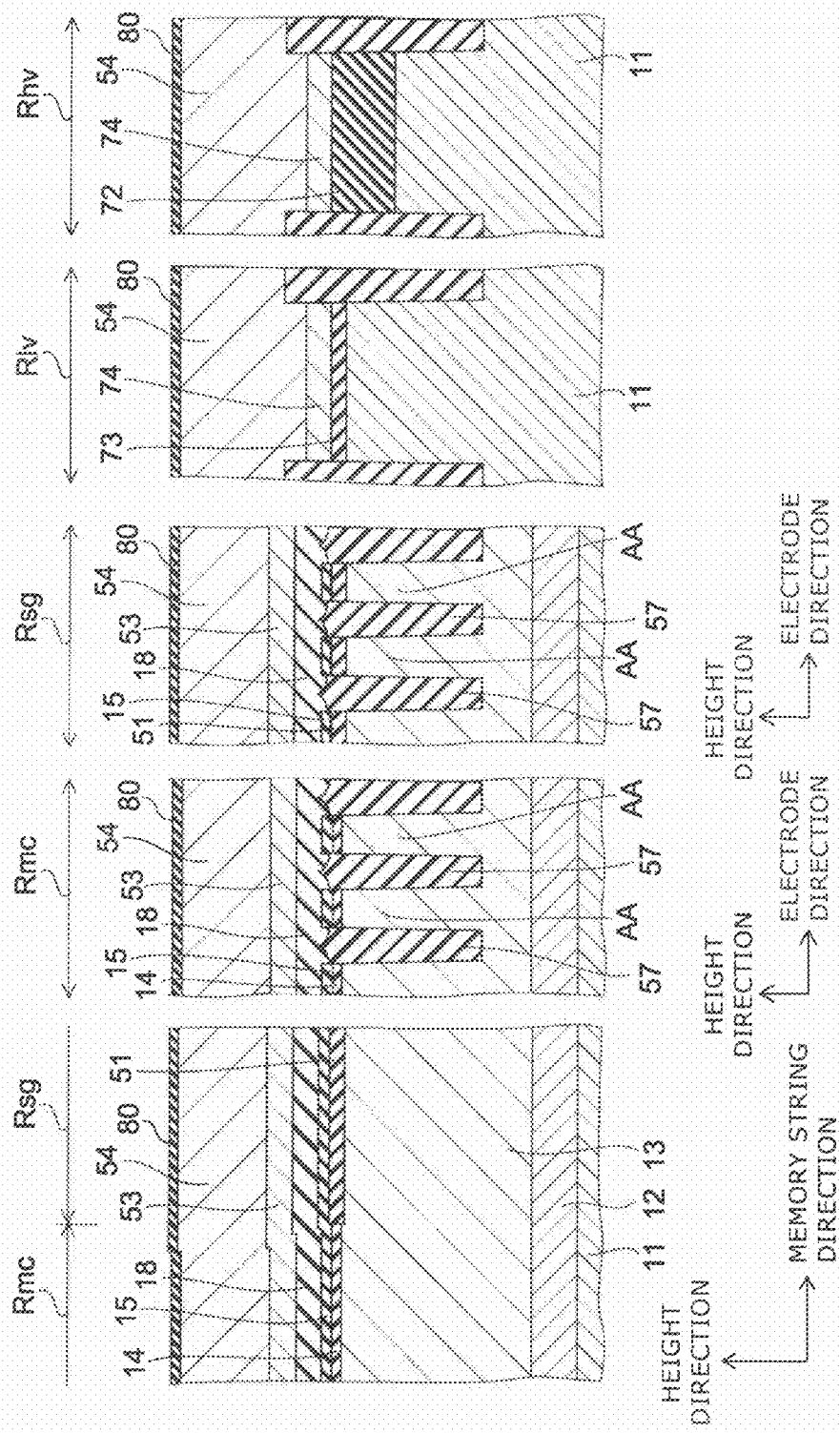
Figures 35A, 35B, 35C, 35D, 35E:
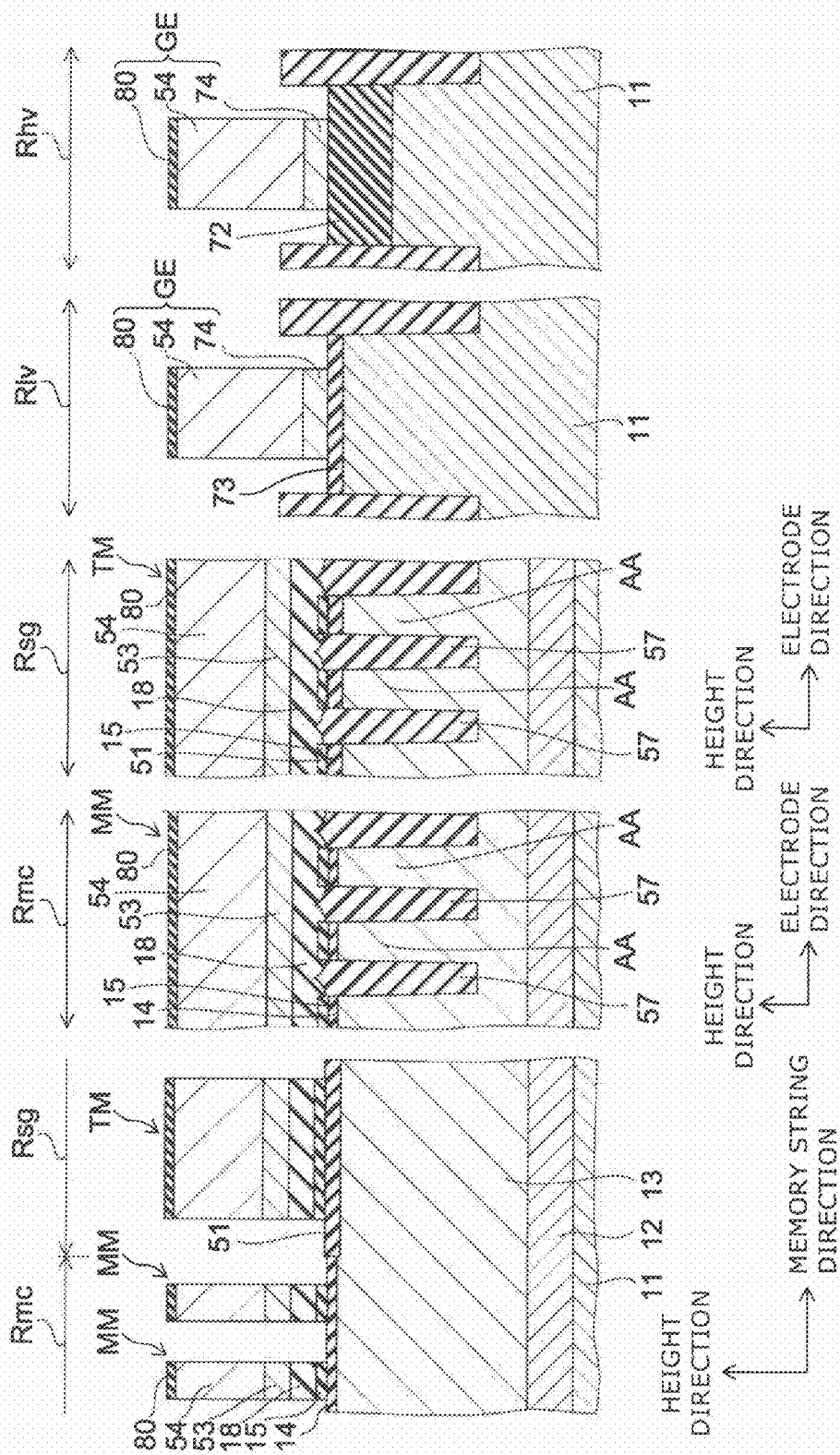

FIGS. 22A and 22B are cross-sectional views parallel to the electrode direction and illustrates the nonvolatile semiconductor memory device according to this embodiment, where FIG. 22A illustrates the memory cell region Rmc, and FIG. 22B illustrates the selection transistor region Rsg.

As illustrated in FIG. 21 and FIGS. 22A and 22B, a nonvolatile semiconductor memory device 2 according to this embodiment differs from the device 1 (see FIG. 1 to FIG. 3) according to the first embodiment described above in the configuration of the insulating film formed between the silicon substrate 11 and the charge storage film 15 and the shape of the upper end portion of the STI.

That is, in the memory cell region Rmc of this embodiment, similarly to the first embodiment described above, the tunnel insulating film 14 is provided between the silicon substrate 11 and the charge storage film 15. In contrast, in the selection transistor region Rsg, unlike the first embodiment, a bottom insulating film 51 is provided between the silicon substrate 11 and the charge storage film 15. The bottom insulating film 51 is made of silicon oxide, for example, and has a film thickness larger than the film thickness of the tunnel insulating film 14. As an example, the tunnel insulating film 14 has a film thickness of 5 nm, and the bottom insulating film 51 has a film thickness of 7 nm.

Further, in an upper surface 57a of an STI 57, a central portion 57b in the width direction of the STI 57, that is, the electrode direction protrudes over a peripheral portion 57c, and the slope from the central portion 57b toward the peripheral portion 57c is a concave curved surface lowering from the central portion 57b toward the peripheral portion 57c. The region in the upper surface 57a of the STI 57 disposed in the selection transistor region Rsg is located higher than the region disposed in the memory cell region Rmc. That is, a difference in level is formed for the upper surface 57a of the STI 57 in the boundary portion between the memory cell region Rmc and the selection transistor region Rsg. Thereby, in this embodiment also, similarly to the first embodiment described above, the shortest distance Lsg between the corner portion of the active area AA and the selection gate electrode SG is longer than the shortest distance Lwl between the corner portion of the active area AA and the word-line electrode WL.

Furthermore, the position of the peripheral portion 57c of the upper surface 57a of the STI 57 in the height direction is located between the upper surface and the lower surface of the charge storage film 15 in both the memory cell region Rmc and the selection transistor region Rsg. In both the memory cell region Rmc and the selection transistor region Rsg, the STI 57 has an apex nearly in the central portion 57b of the upper surface 57a. The position of this apex in the height direction may be higher or lower than the upper surface of the charge storage film 15. Furthermore, in the height direction, the difference between the position of the upper surface 57a in the memory cell region Rmc and the position of the upper surface 57a in the selection transistor region Rsg is nearly equal to the difference between the film thickness of the tunnel insulating film 14 and the film thickness of the bottom insulating film 51.

Furthermore, in this embodiment, the word-line electrode WL and the selection gate electrode SG are disposed in a stacked film in which a metal film 53 and a polysilicon film 54 are stacked in the order from the lower layer side and the alloy layer 20 is disposed in the uppermost layer portion. The configuration other than the above of this embodiment is similar to the first embodiment described above. The upper surface of the block insulating film 18 occasionally has a shape reflecting the shape of the upper surface of the charge storage film 15 and the upper surfaces of the STIs 57.

An example of the composition and film thickness of the films in the device 2 will now be given. As described above, the tunnel insulating film 14 is made of silicon oxide ($SiO_2$) and has a film thickness of 5 nm. The bottom insulating film 51 also is made of silicon oxide and has a film thickness of 7 nm. The charge storage film 15 is made of silicon nitride (SiN) and has a film thickness of 6 nm. The block insulating film 18 is made of alumina ($Al_2O_3$) and has a film thickness of 15 nm. The metal film 53 that forms an electrode is formed of tantalum nitride (TaN), and the polysilicon film 54 is formed of polysilicon with a conductivity type of $N^+$.

Next, a method for manufacturing the nonvolatile semiconductor memory device 2 according to this embodiment will now be described.

FIGS. 23A to 36E are process cross-sectional views illustrating a method for manufacturing a nonvolatile semiconductor memory device according to this embodiment, where each drawing of the number including "A" illustrates a cross section parallel to the memory string direction, each drawing of the number including "B" illustrates a cross section of the memory cell region parallel to the electrode direction, each drawing of the number including "C" illustrates a cross section of the selection transistor region parallel to the electrode direction, each drawing of the number including "D" illustrates a transistor region for low voltage of the peripheral circuit unit, and each drawing of the number including "E" illustrates a transistor region for high voltage of the peripheral circuit unit.

First, as illustrated in FIGS. 23A to 23E, the silicon substrate 11 of P-type is prepared. The upper surface of the silicon substrate 11 is oxidized to form a sacrifice oxide film 71 with a film thickness of, for example, 10 nm over the entire upper surface.

A resist film (not illustrated) that exposes the whole memory array unit and a P-channel transistor formation region of the peripheral circuit unit and covers the other regions is formed by lithography, and impurities serving as a donor such as phosphorus (p) are ion-implanted by using this resist film as a mask. At this time, implantation is performed multiple times by using different acceleration voltages and implantation amounts, as required. Thereby, in the whole memory array unit and the P-channel transistor formation region of the peripheral circuit unit, the N well 12 is formed in the upper portion of the silicon substrate 11. Then, the resist film is peeled off.

A resist film (not illustrated) that exposes an N-channel transistor formation region of the peripheral circuit unit and covers the other regions is formed by lithography, and impurities serving as an acceptor such as boron (B) are ion-implanted by using this resist film as a mask. At this time, implantation is performed multiple times by using different acceleration voltages and implantation amounts, as required. Thereby, in the N-channel transistor formation region of the peripheral circuit unit, a P well (not illustrated) for the peripheral circuit is formed in the upper portion of the silicon substrate 11. Then, the resist film is peeled off.

A resist film (not illustrated) that exposes the memory array unit and covers the other regions is formed by lithography, and impurities serving as an acceptor such as boron (B) are ion-implanted by using this resist film as a mask. At this time, implantation is performed multiple times by using different acceleration voltages and implantation amounts, as required. Thereby, in the memory array unit, the P well 13 for the memory cell transistor is formed in part of the upper portion of the N well 12. Then, the resist film is peeled off.

Lithography and ion implantation are further performed as required to adjust the impurity concentrations of the channel regions of a transistor region for low voltage Rlv and a transistor region for high voltage Rhv of the peripheral circuit unit to respective desired values. Then, the sacrifice oxide film 71 is removed.

As illustrated in FIGS. 24A to 24E, a gate oxide film for high voltage 72 over the entire upper surface of the silicon substrate 11 is formed by an oxidation treatment. A resist film (not illustrated) that covers the transistor region for high voltage Rhv is formed by lithography, and the gate oxide film for high voltage 72 is selectively removed by dry etching using this resist film as a mask. Thereby, the gate oxide film for high voltage 72 is caused to remain only in the transistor region for high voltage Rhv. Then, the resist film is peeled off.

As illustrated in FIGS. 25A to 25E, a gate oxide film for low voltage 73 is formed on the silicon-exposed surface in the upper surface of the silicon substrate 11 by an oxidation treatment. A silicon film 74 is formed over the entire surface. The gate oxide film for low voltage 73 and the silicon film 74 are removed from the memory cell region Rmc and the selection transistor region Rsg by lithography. The selection transistor region Rsg includes the regions in which the contacts 25 are to be formed.

As illustrated in FIGS. 26A to 26E, a silicon oxide film 75 with a thickness of, for example, 5 nm is formed on the exposed surface of the silicon substrate 11 and the exposed surface of the silicon film 74 by a thermal oxidation treatment.

As illustrated in FIGS. 27A to 27E, a resist film (not illustrated) that covers the selection transistor regions Rsg of the memory array unit is formed by lithography. The selection transistor regions Rsg are set at least in a pair of regions away from each other in the memory string direction. The silicon oxide film 75 is selectively removed to be caused to remain only in the selection transistor regions Rsg by a wet etching using this resist film as a mask. The resist film is removed by using hydrogen sulfide ($H_2S$), for example.

As illustrated in FIGS. 28A to 28E, the tunnel insulating film 14 made of silicon oxide and having a thickness of, for example, 5 nm is formed on the silicon-exposed surface by a thermal oxidation treatment. By this oxidation treatment, the silicon oxide film 75 is still further oxidized to grow to form the bottom insulating film 51 that is thicker than the tunnel insulating film 14. For example, the silicon oxide film 75 with a film thickness of 5 nm grows to form the bottom insulating film 51 with a film thickness of 7 nm. The upper surface of the bottom insulating film 51 is located higher than the upper surface of the tunnel insulating film 14, and the lower surface of the bottom insulating film 51 is located lower than the lower surface of the tunnel insulating film 14. A nitriding treatment may be performed after forming the tunnel insulating film 14 to oxynitride part of the tunnel insulating film 14. This improves the data retention capability of memory cell.

A silicon nitride film is deposited over the entire surface to form the charge storage film 15 with a film thickness of, for example, 6 nm. At this time, since the upper surface of the bottom insulating film 51 is located higher than the upper surface of the tunnel insulating film 14, the upper surface of the charge storage film 15 in the selection transistor region Rsg is located higher than the upper surface of the charge storage film 15 in the memory cell region Rmc.

As illustrated in FIGS. 29A to 29E, a silicon oxide film is deposited with a thickness of 10 nm by, for example, CVD to form a pad oxide film 76 over the entire surface. The upper surface of the pad oxide film 76 has unevenness reflected unevenness of the upper surface of the charge storage film 15. That is, the upper surfaces of the charge storage film 15 and the pad oxide film 76 in the selection transistor region Rsg are located higher than the upper surfaces of the charge storage film 15 and the pad oxide film 76 in the memory cell region Rmc, respectively.

A resist film (not illustrated) that covers the memory array unit is formed by lithography, and the pad oxide film 76, the charge storage film 15, and the tunnel insulating film 14 are removed from the peripheral circuit unit by etching using this resist film as a mask. Then, the resist film is removed. Thereby, the silicon film 74 is exposed in the peripheral circuit unit. The tunnel insulating film 14, the bottom insulating film 51, the charge storage film 15, and the pad oxide film 76 remain only in the memory array unit.

A silicon nitride is deposited over the entire surface with a thickness of, for example, 50 nm to form a pad nitride film 77. A BSG (boron silicate glass), for example, is deposited over the entire surface to form a mask material 78 for forming grooves for element isolation.

As illustrated in FIGS. 30A to 30E, a resist film (not illustrated) that exposes the regions in which the STIs 57 are to be formed and covers the other regions is formed by lithography. The mask material 78 (see FIGS. 29A to 29E) is removed from the regions in which the STIs 57 are to be formed by an anisotropic dry etching using this resist film as a mask. The resist film is removed.

In the memory array unit, the pad nitride film 77, the pad oxide film 76, the charge storage film 15, and the tunnel insulating film 14 or the bottom insulating film 51 are selectively removed, and further the upper portion of the silicon substrate 11 is selectively removed by an anisotropic dry etching is performed using the mask material 78 as a mask. On the other hand, in the peripheral circuit unit, the pad nitride film 77, the silicon film 74, and the gate oxide film for high voltage 72 or the gate oxide film for low voltage 73 are selectively removed, and further the upper portion of the silicon substrate 11 is selectively removed. After finishing etching, the remaining mask material 78 (see FIGS. 29A to 29E) is removed. Thereby, a plurality of trenches 56 are formed in the upper portion of the silicon substrate 11 and the films stacked thereon.

In the memory array unit, the trenches 56 extend in the memory string direction so as to connect a pair of selection transistor regions Rsg to each other. The trenches 56 divide the P well 13 in the electrode direction into the plurality of active areas AA extending in the memory string direction. In the peripheral circuit unit, the trench 56 extends in any direction. A silicon oxide 79 is buried in the trenches 56, and the upper surface of the silicon oxide 79 is planarized by CMP using the pad nitride film 77 as a stopper.

As illustrated in FIGS. 31A to 31E, the upper surface of the silicon oxide 79 buried in the trench 56 is lowered by dry etching. That is, the upper portion of the silicon oxide 79 is removed. At this time, in the height direction, the upper surface of the silicon oxide 79 is caused to be located between the upper surface and the lower surface of the pad nitride film 77.

At this point, the position of the upper surface of the silicon oxide 79 in the height direction is nearly the same in both the memory cell region Rmc and the selection transistor region Rsg.

As illustrated in FIGS. 32A to 32E, the pad nitride film 77 (see FIGS. 31A to 31E) is removed by wet etching. Thereby, the upper portion of the silicon oxide 79 protrudes from the upper surface of the pad oxide film 76 or the silicon film 74.

As illustrated in FIGS. 33A to 33E, in the memory array region and the selection transistor region Rsg, isotropic etching such as wet etching is performed. Thereby, the pad oxide film 76 (see FIGS. 32A to 32E) is removed. The upper portion of the silicon oxide 79 also is etched and the remaining portion forms the STI 57. At this time, since the side surface as well as the upper surface of the protruding portion of the silicon oxide 79 is exposed, the etching amount for the peripheral portion in the width direction is larger than the etching amount for the central portion in the memory string direction. The upper surface 57a of the STI 57 has the central portion 57b in the width direction which protrudes upward over the peripheral portion 57c in the memory string direction. The slope from the central portion 57b toward the peripheral portion 57c in the upper portion of the STI 57 becomes a concave curved surface lowering from the central portion 57b toward the peripheral portion 57c. The silicon oxide 79 remaining in the trench 56 in the peripheral circuit unit also is hereinafter referred to as the "STI 57."

The etching amount in this isotropic etching is equal in both the memory cell region Rmc and the selection transistor region Rsg. Therefore, the height of the upper surface 57a of the STI 57 after the isotropic etching is determined by the height of the upper surface of the charge storage film 15 before the isotropic etching. That is, this isotropic etching adjusts the height of the upper surface 57a of the STI 57 by using the charge storage film 15. Further, as described above, the upper surface of the charge storage film 15 in the selection transistor region Rsg is located higher than the upper surface of the charge storage film 15 in the memory cell region Rmc, and consequently the upper surface 57a of the STI 57 in the selection transistor region Rsg is located higher than the upper surface 57a of the STI 57 in the memory cell region Rmc as a whole.

On the other hand, in the peripheral circuit unit, the upper portion of the STI 57 is not etched. Thereby, in the peripheral circuit unit, the height of the STI 57 is high to improve the breakdown voltage. In particular, in the transistor region for high voltage Rhv, there is a case where a gate electrode is formed on the STI 57. In this case, forming the STI 57 high can improve the breakdown voltage between the gate electrode and the silicon substrate.

As illustrated in FIGS. 34A to 34E, alumina, for example, is deposited over the entire surface to form the block insulating film 18. At this time, since the block insulating film 18 is formed by a deposition method, it has a nearly uniform film thickness as a whole. A metal having a large work function such as tantalum nitride (TaN) is deposited on the block insulating film 18 to form the metal film 53. A polysilicon, for example, is deposited on the entire surface to form a mask material (not illustrated). A resist film (not illustrated) is formed so as to cover the memory array unit by lithography. The mask material is selectively removed to cause it to remain only in the memory array unit by a dry etching or a wet etching using this resist film as a mask. The metal film 53 and the block insulating film 18 are removed from the regions other than the memory array unit by etching using this mask material as a mask. Thereby, the block insulating film 18 remains only in the memory array unit and is disposed so as to cover the charge storage film 15 and the STIs 57.

A polysilicon doped with impurities serving as a donor to have a conductivity type of $N^+$ is deposited by, for example, CVD to film-form the polysilicon film 54. A silicon nitride film 80 is film-formed on the entire surface. Thereby, the metal film 53, the polysilicon film 54, and the silicon nitride film 80 are stacked on the block insulating film 18 in the memory array unit; and the silicon film 74, the polysilicon film 54, and the silicon nitride film 80 are stacked above the gate oxide film for high voltage 72 or the gate oxide film for low voltage 73 in the peripheral circuit unit. The silicon film 74, the metal film 53, and the polysilicon film 54 are conductive films.

As illustrated in FIGS. 35A to 35E, the electrodes are processed by using lithography and dry etching. That is, in the memory cell region Rmc of the memory array unit, the stacked film formed of the tunnel insulating film 14, the charge storage film 15, the block insulating film 18, the metal film 53, the polysilicon film 54, and the silicon nitride film 80 is processed into the memory cell stacked bodies MM extending in the electrode direction; in the selection transistor region Rsg, the stacked film formed of the bottom insulating film 51, the charge storage film 15, the block insulating film 18, the metal film 53, the polysilicon film 54, and the silicon nitride film 80 is processed into the transistor stacked body TM extending in the electrode direction; and in the peripheral circuit unit, the stacked film formed of the silicon film 74, the polysilicon film 54, and the silicon nitride film 80 is processed into gate electrodes GE of a high voltage transistor and a low voltage transistor that form the peripheral circuit. At this time, in the memory array unit, the processed metal film 53 and polysilicon film 54 form the word-line electrodes WL and the selection gate electrodes SG extending in the electrode direction. The gate electrode GE may extend in either of the electrode direction or the memory string direction.

As illustrated in FIGS. 36A to 36E, the source/drain region of each transistor is formed by impurity implantation. That is, by using lithography, ion implantation is performed on the memory cell transistors and the selection transistors of the memory array unit, and the high voltage transistor and the low voltage transistor of the peripheral circuit unit, with ion species, acceleration voltages, and implantation amounts appropriate for the respective transistors. An anneal is performed at a temperature of, for example, 950° C. to activate the implanted impurities. Thereby, the source/drain diffusion layers 21 of $N^-$-type, for example, are formed in the upper portion of the P well 13.

An insulating material such as silicon oxide is deposited on the entire surface. The upper surface of the insulating materials is planarized by CMP using the silicon nitride film 80 (see FIGS. 35A to 35E) as a stopper. Thereby, the insulating material is buried between the electrodes. The silicon nitride film 80 is removed by a dry etching. Cobalt (Co) is deposited on the electrodes and an anneal is performed at an appropriate temperature. Thereby, the upper surface of the polysilicon film 54 is silicidized to form the alloy layer 20. The alloy layer 20 is formed in order to reduce the resistance of the electrode.

As illustrated in FIG. 21 and FIGS. 22A and 22B, an insulating material such as silicon oxide is deposited on the entire surface to form the interlayer insulating film 23. The contact holes 24 are formed in the regions in the interlayer insulating film 23 immediately above the gate electrodes GE (see FIGS. 35A to 35E) and part of the source/drain diffusion layers 21. A conductive material is buried in the contact hole 24 to form the contact 25 electrically connected to the gate electrode GE or the source/drain diffusion layer 21.

Wirings including the bit lines 26 and the interlayer insulating film 27 are formed on the interlayer insulating film 23; via contacts (not illustrated) that electrically connect wirings are formed in the interlayer insulating film 27; and pads for bonding (not illustrated) and a passivation layer (not illustrated) are formed. Thereby, the peripheral circuit unit is formed in addition to the memory array unit. In the peripheral circuit unit, a driving circuit that drives the memory array unit and an input/output circuit that inputs and outputs data with the outside of the device 2 are formed. Thus, the nonvolatile semiconductor memory device 2 according to this embodiment is manufactured.

Next, the operation and effects of this embodiment will now be described.

In this embodiment, the gate insulating film of the memory cell transistor is formed of the stacked film of the tunnel insulating film 14, the charge storage film 15, and the block insulating film 18. On the other hand, the gate insulating film of the selection transistor is formed of the stacked film of the bottom insulating film 51, the charge storage film 15, and the block insulating film 18. Since the bottom insulating film is thicker than the tunnel insulating film 14, the gate insulating film of the selection transistor is thicker than the gate insulating film of the memory cell transistor. Thereby, the shortest distance Lsg between the corner portion of the active area AA and the selection gate electrode SG is longer than the shortest distance Lwl between the corner portion of the active area AA and the word-line electrode WL, and the electric field applied to the charge storage film 15 disposed in the selection gate region Rsg is weak, which can decrease the amount of charges injected into the charge storage film 15.

Furthermore, the tunnel insulating film 14 is formed thicker, it is possible to decrease the amount of charges passing through the tunnel insulating film 14 at the time of reading operation of the device 2. This also can decreases the amount of charges injected into the charge storage film 15.

Furthermore, in this embodiment, since the bottom insulating film 51 is formed thicker than the tunnel insulating film 14, the region in the upper surface of the charge storage film 15 located in the selection transistor region Rsg is located higher than the region located in the memory cell region Rmc in the process illustrated in FIGS. 32A to 32E. Thereby, the upper surface 57a of the STI 57 in the selection transistor region Rsg can be higher as a whole than the upper surface 57a of the STI 57 in the memory cell region Rmc in the process illustrated in FIGS. 33A to 33E. Since the block insulating film 18 formed so as to cover the STIs 57 is formed by a deposition method, it has a nearly uniform film thickness as a whole. This also can make the shortest distance Lsg longer than the shortest distance Lwl.

The above effects can suppress to store charges in the charge storage film 15 of the selection transistor region Rsg at the time of reading operation of the device 2. This can achieve a small variation in the threshold of the selection transistor and stable operation, even if reading operation is performed repeatedly.

Furthermore, in the memory cell region Rmc, the upper surface of the STI 57 in contact with the charge storage film 15 is lower than the upper surface of the charge storage film 15. Consequently, the electric field of the boundary portion between the charge storage film 15 and the STI 57 is strong. On the other hand, although the STI 57 in the selection transistor region Rsg has the same shape as the STI 57 in the memory cell region Rmc, the bottom insulating film 51 is formed thicker than the tunnel insulating film 14. Accordingly, this can suppress to store charges in the charge storage film 15 of the selection transistor region Rsg. Consequently, the threshold of the selection transistor can be prevented from varying, while the programming characteristics of the memory cell transistor is improved.

Moreover, the gate insulating film of the memory cell transistor and the gate insulating film of the selection transistor are common in that both include the charge storage film 15 and the block insulating film 18. Therefore, both can share the forming process partly. Accordingly, the gate insulating film can be fabricated-separated with the memory cell transistor and the selection transistor by a small number of additional processes. Consequently, the device 2 can be manufactured easily at low cost. Furthermore, the configurations of the charge storage film 15 and the films thereabove are common in both the memory cell region Rmc and the selection transistor region Rsg. Therefore, the fabricating-separation of the insulating film described above has a limited influence on the characteristics of the memory cell transistor.

Hereinabove, the invention is described with reference to embodiments. However, the invention is not limited to these embodiments. One skilled in the art may appropriately perform an addition, deletion or design modification of a component, or an addition, omission or condition alteration of a process on the embodiments described above. Such practice is included in the scope of the invention to the extent that the spirit of the invention is included.

For example, the material and film thickness of the tunnel insulating film, the charge storage film, the block insulating film, and the electrodes may be set with alteration within a range in which the effect thereof can be obtained. For example, although the tunnel insulating film is illustrated as a single-layer silicon oxide film ($SiO_2$ film) with a thickness of 0.5 to 10 nm in the embodiments described above, the invention is not limited to thereto. However, a stacked film of (SiN film/$SiO_2$ film), a stacked film of ($SiO_2$ film/SiN film/$SiO_2$ film), a stacked film of ($SiO_2$ film/high dielectric constant insulating film/$SiO_2$ film), or a stacked film of (high dielectric constant insulating film/$SiO_2$ film) having an equal thickness on an EOT (equivalent oxide thickness) basis and the like may be used instead of the single-layer silicon oxide film. In this stacked film, the $SiO_2$ film is disposed on the silicon substrate 11 side.

Furthermore, although the charge storage film is illustrated as a silicon nitride film (SiN film) with a thickness of 3 to 50 nm in the embodiments described above, the charge storage film is not limited to the silicon nitride film, but other insulating films may be used to the extent that they have the capability of capturing an electron or hole. For example, a high dielectric film made of HfAlO or the like, and a stacked film formed of a plurality of films of a silicon nitride film, HfAlO film, alumina film, and the like may be used. Specifically, the stacked film may be a high dielectric constant insulating film having a higher dielectric constant than a silicon oxide film ($SiO_2$ film) such as a stacked film including an $Al_2O_3$ film, MgO film, SrO film, BaO film, TiO film, $Ta_2O_5$ film, $BaTiO_3$ film, BaZrO film, $ZrO_2$ film, $HfO_2$ film, $Y_2O_3$ film, ZrSiO film, HfSiO film, LaAlO film, or the like. The film configuration of this stacked film is, for example, (SiN film/high dielectric constant insulating film/SiN film), (SiN film/high dielectric constant insulating film/HfAlO film), (HfAlO film/high dielectric constant insulating film/HfAlO film), or the like. Alternatively, (HfAlO film/high dielectric constant insulating film/SiN film) may be used, and in this case the SiN film is disposed on the tunnel insulating film side.

Furthermore, although the high dielectric constant insulating film that forms the block insulating film is illustrated as an alumina film ($Al_2O_3$ film) with a thickness of 3 to 50 nm in the embodiments described above, the block insulating film has only to prevent an electron injected from the silicon substrate into the charge storage film from leaking to the word-line electrode at the time of programming, and to prevent an electron from being injected from the word-line electrode into the charge storage film at the time of erasing. Therefore, the block insulating film is not limited to the alumina film. However, the block insulating film preferably has a high energy barrier for electron at both interfaces thereof, and at least part of the block insulating film preferably includes a high dielectric film having a higher relative permittivity than the tunnel insulating film. The block insulating film may be an insulating film made of an oxide other than alumina, for example, LaAlO or the like, or a stacked film formed of a plurality of insulating films. Specifically, the block insulating film may be a high dielectric constant insulating film having a higher dielectric constant than a silicon oxide film. For example, a single layer or stacked film of an MgO film, SrO film, SiN film, BaO film, TiO film, $Ta_2O_5$ film, $BaTiO_3$ film, BaZrO film, $ZrO_2$ film, $HfO_2$ film, $Y_2O_3$ film, ZrSiO film, HfSiO film, LaAlO film, and/or the like may be used. The film configuration of such a stacked film may be, for example, ($SiO_2$ film/high dielectric constant insulating film/$SiO_2$ film), ($SiO_2$ film/high dielectric constant insulating film), (high dielectric constant insulating film/$SiO_2$ film), (high dielectric constant insulating film/$SiO_2$ film/high dielectric constant insulating film), or the like. Furthermore, an $Al_2O_3$ film may be added to this stacked film, and an $Al_2O_3$ film may be used instead of the $SiO_2$ film in this stacked film.

Furthermore, the above-described embodiments give the example in which the electrodes, that is, the word-line electrode WL and the selection gate electrode SG are formed by the stacked film of the polysilicon film 19 and the alloy layer 20, the polysilicon film 19 is formed of a $p^+$-type polysilicon film doped with high-concentration impurities (p-type impurities) serving as an acceptor, and the alloy layer 20 is formed of, for example, a cobalt silicide (CoSi) layer. However, the invention is not limited to thereto. For example, an $n^+$-type polysilicon film doped with high-concentration impurities (n-type impurities) serving as a donor may be used as the polysilicon film 19. Alternatively, instead of the polysilicon film 19, a stacked film of (metal film/polysilicon film), a stacked film of (metal film/metal nitride film), a stacked film of (metal film/metal carbide film), or the like may be used. In this case, a tungsten film (W film) or the like, for example, may be used as the metal film, a WN film, TaN film, TiN film, or the like, for example, may be used as the metal nitride film, and a TaC film or the like, for example, may be used as the metal carbide film. Furthermore, NiSi, WSi, MoSi, TiSi, or the like as well as CoSi may be used as the metal silicide that forms the alloy layer 20.

Moreover, although each of the above-described embodiments gives the example in which the upper surface of the electrode is silicidized, the invention is not limited to thereto. For example, a (TaN/WN/W) stacked film may be used for the word-line electrode and the selection gate electrode of the memory array unit, and a (polysilicon/TaN/WN/W) stacked film may be used for the gate electrode of the peripheral circuit unit. Furthermore, the timing of forming the gate electrode of the peripheral circuit unit may be altered appropriately to the extent that the configurations of the memory cell transistor and the selection transistor described above are obtained.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A nonvolatile semiconductor memory device comprising:
   a semiconductor substrate having an upper portion being partitioned into a plurality of semiconductor portions extending in a first direction;
   charge storage films provided on the semiconductor portions;
   a word-line electrode provided on the semiconductor substrate and extending in a second direction intersecting with the first direction; and
   a pair of selection gate electrodes provided on both sides of the word-line electrode in the first direction on the semiconductor substrate and extending in the second direction,
   the charge storage films being disposed between the semiconductor substrate and the word-line electrode and between the semiconductor substrate and the selection gate electrodes, and
   a shortest distance between a corner portion of each of the semiconductor portions and each of the selection gate electrodes being longer than a shortest distance between the corner portion of the semiconductor portion and the word-line electrode in a cross section parallel to the second direction.

2. The device according to claim 1, further comprising;
   a plurality of element isolation insulating films formed in the upper portion of the semiconductor substrate and partitioning the upper portion into the plurality of semiconductor portions,
   a region in an upper surface of each of the element isolation insulating films immediately below each of the selection gate electrodes being located higher than a region immediately below the word-line electrode.

3. The device according to claim 2, wherein
   the upper surface of each of the element isolation insulating films is located higher than an upper surface of the charge storage film in the region immediately below each of the selection gate electrodes, and
   the upper surface of each of the element isolation insulating films is at the same height as the upper surface of the charge storage film in the region immediately below the word-line electrode.

4. The device according to claim 2, further comprising;
   a tunnel insulating film provided between each of the semiconductor portions and the charge storage film; and
   a block insulating film provided between the charge storage films and the element isolation insulating films, and the word-line electrode and having a dielectric constant higher than a dielectric constant of the element isolation insulating films, and
   a lower surface of the block insulating film located immediately above each of the element isolation insulating films being located lower than an upper surface of the charge storage films and higher than a lower surface thereof.

5. The device according to claim 4, wherein
   the semiconductor substrate is made of silicon,
   the tunnel insulating film is an $SiO_2$ film, a stacked film of an SiN film and $SiO_2$ film, or a stacked film of a high dielectric constant insulating film made of an insulating material having a dielectric constant higher than a dielectric constant of $SiO_2$ and an $SiO_2$ film, the charge storage film is one film or a stacked film of two or more films selected from the group consisting of an SiN film, $Al_2O_3$ film, MgO film, SrO film, BaO film, TiO film, $Ta_2O_5$ film, $BaTiO_3$ film, BaZrO film, $ZrO_2$ film, $HfO_2$ film, $Y_2O_3$ film, ZrSiO film, HfSiO film, and LaAlO film, the block insulating film is one film or a stacked film of two or more films selected from the group consisting of an $Al_2O_3$ film, MgO film, SrO film, SiN film, BaO film, TiO film, $Ta_2O_5$ film, $BaTiO_3$ film, BaZrO film, $ZrO_2$ film, $HfO_2$ film, $Y_2O_3$ film, ZrSiO film, HfSiO film, and LaAlO film, and the element isolation insulating films are made of silicon oxide.

6. The device according to claim 2, wherein a region in the upper surface of each of the element isolation insulating films immediately below the word-line electrode is located lower than a lower surface of the charge storage film.

7. The device according to claim 1, further comprising:

a tunnel insulating film provided between the semiconductor substrate and the charge storage film and immediately below the word-line electrode; and a bottom insulating film provided between the semiconductor substrate and the charge storage film and immediately below each of the selection gate electrodes and being thicker than the tunnel insulating film.

8. The device according to claim 7, wherein the tunnel insulating film and the bottom insulating film are made of silicon oxide.

9. The device according to claim 7, further comprising:

a plurality of element isolation insulating films formed in the upper portion of the semiconductor substrate and partitioning the upper portion into the plurality of semiconductor portions, and a central portion in the second direction of an upper surface of each of the element isolation insulating films protruding over a peripheral portion.

10. The device according to claim 1, wherein the word-line electrode and each of the selection gate electrodes each includes:

a polysilicon film; and an alloy layer provided on the polysilicon film and made of metal silicide.

11. The device according to claim 1, wherein the word-line electrode and each of the selection gate electrodes each includes:

a metal film made of tantalum nitride;

a polysilicon film provided on the metal film; and an alloy layer provided on the polysilicon film and made of metal silicide.

12. The device according to claim 2, wherein a level difference is formed in the upper surface of each of the element isolation insulating films between the region immediately below one of the selection gate electrodes and the region immediately below the word-line electrode.

* * * * *